(12) United States Patent
Nishimura et al.

(10) Patent No.: US 8,659,168 B2
(45) Date of Patent: Feb. 25, 2014

(54) WIRING BOARD FOR FLIP-CHIP MOUNTING, MOUNTING STRUCTURE OF ELECTRONIC COMPONENTS ON WIRING BOARD, AND SEMICONDUCTOR DEVICE INCLUDING WIRING BOARD

(75) Inventors: Takao Nishimura, Kawasaki (JP); Yoshikazu Kumagaya, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 612 days.

(21) Appl. No.: 12/047,811

(22) Filed: Mar. 13, 2008

(65) Prior Publication Data

US 2008/0224325 A1 Sep. 18, 2008

(30) Foreign Application Priority Data

Mar. 16, 2007 (JP) .................................. 2007-069346

(51) Int. Cl.
*H01L 23/48* (2006.01)
(52) U.S. Cl.
USPC .................................. 257/778; 257/E23.003
(58) Field of Classification Search
USPC .................................. 257/773, 778, E23.003
See application file for complete search history.

(56) References Cited

U.S. PATENT DOCUMENTS

| 7,078,331 | B2 * | 7/2006 | Kwon et al. ................... 438/612 |
| 7,304,394 | B2 | 12/2007 | Seko |
| 7,477,523 | B2 | 1/2009 | Tsuji |
| 2005/0046023 | A1 * | 3/2005 | Takahashi et al. ............ 257/734 |
| 2005/0185880 | A1 * | 8/2005 | Asai ................................. 385/14 |
| 2005/0211465 | A1 * | 9/2005 | Sunohara et al. ............. 174/260 |
| 2005/0224939 | A1 * | 10/2005 | Seko ............................. 257/678 |
| 2006/0289972 | A1 * | 12/2006 | Nishimura et al. ........... 257/666 |

FOREIGN PATENT DOCUMENTS

| JP | 8-139126 | | 5/1996 |
| JP | 10-56260 | A | 2/1998 |
| JP | 11-186322 | A | 7/1999 |
| JP | 11-214440 | A | 8/1999 |
| JP | 2000-77471 | A | 3/2000 |
| JP | 2003-46213 | A | 2/2003 |
| JP | 2003046213 | * | 2/2003 |
| JP | 3115062 | U | 9/2005 |
| JP | 2007-227708 | A | 9/2007 |
| KR | 20060045563 | A | 5/2006 |

OTHER PUBLICATIONS

Korean Office Action dated Mar. 15, 2010, issued in corresponding Korean Patent Application No. 10-2008-0023741.

(Continued)

*Primary Examiner* — Kimberly Rizkallah
*Assistant Examiner* — Duy T Nguyen
(74) *Attorney, Agent, or Firm* — Fujitsu Patent Center

(57) ABSTRACT

A wiring board includes a main surface where an electronic component is mounted in a face-down manner so that a surface of the electronic component having plurality of external connecting terminals faces the main surface of the wiring board, the electronic component being fixed to the wiring board by an adhesive; an insulating layer formed on the main surface where the electronic component is mounted; an opening part formed in the insulating layer so that a plurality of adjacent wiring patterns are commonly and partially opened, the adjacent wiring patterns having electrodes where electrodes of the electronic component are connected; wherein an outer periphery of the opening part situated at a center side of the wiring board is formed in an oblique direction against extending directions of the wiring patterns.

14 Claims, 24 Drawing Sheets

(56) References Cited

OTHER PUBLICATIONS

Korean Office Action dated Aug. 26, 2009, issued in corresponding Korean Patent Application No. 2008-0023741.

Japanese Office Action mailed Jul. 5, 2011 for corresponding Japanese Application No. 2007-069346, with partial English-language translation.

* cited by examiner

WIRING BOARD FOR FLIP-CHIP MOUNTING, MOUNTING STRUCTURE OF ELECTRONIC COMPONENTS ON WIRING BOARD, AND SEMICONDUCTOR DEVICE INCLUDING WIRING BOARD

CROSS-REFERENCE TO RELATED APPLICATION

The present application is based upon and claims the benefit of priority of the prior Japanese Patent Application No. 2007-069346, filed Mar. 16, 2007, the entire contents of which are incorporated herein by reference.

BACKGROUND OF THE INVENTION

1. Field of the Invention

The present invention generally relates to wiring boards, a mounting structure for electronic components, and semiconductor devices, and more specifically, to an wiring board for mounting electronic components such as for a semiconductor device, the mounting structure for the electronic components, and the semiconductor device.

2. Description of the Related Art

There is a semiconductor device which includes a substrate material that is insulating resin such as glass epoxy resin or the like, a wiring board having a selectively provided conducting layer such as copper (Cu), an external connecting terminal having plural projections (projection form) named as bumps arranged in line on a main plane of a semiconductor integrated circuit device (named as semiconductor element) connected to the conducting layer, and the other main plane of the wiring board having another external connecting terminal selectively provided with spherical electrode terminals on the surfaces of the electrodes. Namely, the semiconductor element is mounted face down on a wiring board. Such a flip-chip mounting structure is formed by the following technique.

A flip-chip mounted substrate includes a semiconductor chip mounted by flip-chip mounting, bumps on the semiconductor chip, a substrate material having a wired layer to be connected to the bumps, metal bumps and the wired layer formed on the substrate material, and a solder resist providing openings located on a part to connect the metal bumps and the wired layer. With the semiconductor chip mounted on the substrate material, an underfill material is supplied into a gap between the semiconductor chip and the substrate material. The openings are formed to be peripheral openings, extended to the outside of the semiconductor chip (see reference 3). The flip-chip mounted semiconductor chip, which has bumps that are provided on the semiconductor chip with solder, is flip-chip mounted on conducting patterns of the wiring board. The conducting patterns are provided with wiring patterns and bumps to be connected to connecting pads. For the line size of the wiring pattern, the size of the connecting pads is designed to become bigger (see reference 4). In a circuit pattern in which a wiring pattern is covered with solder resist, the region of the wiring pattern exposed by the solder resist is used for electrodes of the circuit pattern, wherein the circuit pattern is designed for the electrodes to be included in a maximum line size part (see reference 5).

Reference 1 Japanese Patent Application Publication No. 10-56260
Reference 2 Japanese Patent Application Publication No. 11-214440
Reference 3 Japanese Patent Application Publication No. 11-186322
Reference 4 Japanese Patent Application Publication No. 2000-77471
Reference 5 Japanese Utility Model Registration Application No. 3115062

When a semiconductor element is connected to and mounted on the wiring board by the flip-chip mounting technique described above using the wiring board having the structure described above, it is possible that a bubble (void) is formed at an opening part in the underfill material, particularly at the end part (edge part) of the opening part that is near the center of the wiring board. For this phenomenon an explanation is made with referred to FIG. 1 or FIG. 5.

FIG. 1 is an illustrative drawing showing a plan view of a conventional wiring board on which a semiconductor element is flip-chip mounted. Referring to FIG. 1, a wiring board 10 to be used for the flip-chip mounting includes an insulating resin such as a glass epoxy resin and the like as a substrate material 1; one side of the main plane on it includes a copper (Cu) wiring pattern 2 that is arranged at predetermined places.

Further, the wiring pattern 2 includes bonding electrodes 3. The bonding electrode 3 is formed to be wider than the wiring pattern 2 except where they meet.

Further, a solder resist layer (insulating resin) 5 is formed on the surface including an opening pattern (opening part 4) along a line arranged by plural bonding electrodes 3.

A peripheral part in a longitudinal direction of the opening part 4, for the inner part and the outer part of the wiring board 10, is formed to be almost parallel to the arranged line of the bonding electrodes 3.

In FIG. 1, an alternate long and short dash line X indicates a peripheral area of a semiconductor element 20 (in FIG. 2 or FIG. 5) to be mounted face down on the wiring board 10.

After the semiconductor 20 is mounted face down on the wiring board 10, plural convex shaped external connecting terminals 21 (FIG. 2 or FIG. 5), named as bump that are provided on the main plane of the semiconductor element 20, are connected to the corresponding bonding electrodes 3 of the wiring board 10.

FIG. 2 and FIG. 5 are illustrative drawings to show a flip-chip mounting process where the semiconductor 20 is mounted on the wiring board 10 of FIG. 1.

In each figure, (a) shows an enlarged view of a part encompassed by a broken ellipse-like line in FIG. 1. Each (b) shows a cross-sectional view of the part indicated by a line A-A or a line C-C in (a) of the individual figures, in which the semiconductor element 20 is mounted on the wiring board 10. Each (c) shows a cross-sectional view of the part indicated by a line B-B in (a) of the individual figures.

Further, in each (a), the single-dot broken line X indicates the peripheral area where the semiconductor element 20 is mounted face down on the wiring board 10. The circular single-dot broken lines Y indicate the areas where the convex shaped external connecting terminals 21 of the semiconductor element 20 are connected to the bonding electrodes 3 of the wiring board 10.

Further, the arrows in each FIG. 2 and FIG. 5 indicate the directions of flow for an underfill material 25, as described later.

With reference to FIG. 2, the semiconductor element 20 is flip-chip mounted onto the wiring board 10 as indicated in FIG. 1.

First, on the main plane of the wiring board 10 and at the central part included in the area on which the semiconductor 20 is mounted, the underfill material 25 such as thermosetting adhesive or the like is provided by a coating technique or the like.

Then, for the wiring board 10, a conducting material 6, made of solder including predominantly lead (Sn) is previously provided and formed on the wiring pattern 2.

Further, for the semiconductor element 20, the convex shaped external connecting terminals 21 named as bumps are formed on the electrode pads 22 for the external connecting terminals on the main plane of the semiconductor element 20 by using a ball bonding technique i.e. a wire bonding technique.

Continuing, the semiconductor element 20 is stuck and held on a sticking tool (not shown) that is heated above the melting point of the conducting material 6; and placed facing the wiring board 10 in a bonding position (not shown). A positioning alignment is performed between the convex shaped external connecting terminals 21 and the bonding electrodes 3 of the wiring board 10.

Further, the sticking tool is lowered, and the convex shaped external connecting terminals 21 is contacted on the conducting material 6 provided on the bonding electrodes 3, and then the conducting material 6 is melted.

As a result, the conducting material 6 covers at least the convex shaped part of the convex shape external connecting terminals 21, and this connects the convex shaped external connecting terminals 21 of the semiconductor element 20 and the bonding electrodes 3 of the wiring board 10.

On the other hand, in the process in which the sticking tool is lowered and the convex shaped external connecting terminals 21 contact the conducting material 6 provided on the bonding electrodes 3, the underfill material 25, provided on the wiring board 10, is pushed up by the semiconductor element 20 and starts flowing through the gaps between the semiconductor element 20 and the wiring board 10.

Then in the process in which the convex shaped external connecting terminals 21 of the semiconductor 20 are connected to the bonding electrodes 3 through the conducting material 6, the underfill 25 having started flowing flows toward the peripheral direction of the semiconductor element 20 due to capillarity effect as time passes.

As shown in FIG. 2, at a part of the wiring board 10 where the wiring pattern 2 is not provided, a step is formed corresponding to a formed thickness a of the solder resist layer 5. For another part in which the wiring pattern 2 is formed, another step is formed corresponding to another formed thickness b of the difference between the conducting material 6 deposited and formed on the wiring pattern 2 and the solder resist layer 5.

The step 'a' at the part at which the wiring pattern 2 is not provided, is bigger than that of the step 'b' in which the wiring pattern 2 is provided (a>b).

Therefore, the distance between the wiring pattern 2 and the underfill material 25 flowing on the solder resist layer 5 is less than that between the substrate material 1 of the wiring board 10 and the underfill material 25 flowing on the solder resist layer 5 in which there is no wiring pattern 2, so that as the flowing of the underfill material 25 continues the flowing velocity of the underfill material 25 on the wiring pattern 2 is faster than that where no wiring pattern 2 exists.

Further, in general, as the wetting velocity of a liquid adhesive on a metal surface is faster than that on a resin surface, the flowing velocity of the underfill material 25 on the wiring pattern 2 is faster than that on the substrate material 1 of the wiring board 10, i.e. no wiring pattern 2 is formed on it.

Therefore, as indicated by the arrows in FIG. 3, the flow of the underfill material 25, flowing into the inner part of the opening part 4 from the peripheral and longitudinal direction of the opening part 4 that is formed to be almost parallel to the arranged direction of the bonding electrodes 3, flows faster on the wiring patten 2 than on the substrate material 1 of the wiring board 10 on which no wiring pattern 2 is formed, and the underfill material 25 flowing on the wiring pattern 2 flows into a region where no wiring pattern 2 is formed.

Thus, the underfill material 25 flowing on the substrate material 1 on the wiring board 10 flows as if being pulled by two flows of the underfill material 25 at both neighboring sides where each side is on the wiring pattern 2, having almost equivalent flowing velocities.

Thereby, while the flow of the underfill material 25 continues, as shown in FIG. 4, due to a difference in flow velocities of the underfill material 25 on parts of the wiring pattern 2 and no wiring pattern 2 and a difference in the flow directions, it is possible to cause a void around an edge of an opening part 4, where the substrate material 1 is exposed and close to the wiring pattern 2 in the opening part 4.

As shown in FIG. 5, when the underfill material 25 flows over almost the whole area of the opening part 4, a filling process of the underfill material 25 is completed and at the same time the underfill material 25 is solidified by the heat provided through the sticking tool (not shown) that is used to mount the semiconductor element 20 on the wiring board 10.

Thus, the convex shaped external connecting terminals 21 and the bonding electrodes 3 of the wiring board 10 are connected by heating solder (soldering), and the underfill material 25, being spread all over the area between the semiconductor element 20 and the wiring board 10, is solidified by heating so that the semiconductor element 20 and the wiring board 10 are stuck together. The connecting areas of the convex shaped external connecting terminals 21 of the semiconductor element 21 are covered by the underfill material 25, wherein the void B is formed and can remain without flowing out at a part around the opening edge of the opening part 4, where the substrate material 1 is exposed and no wiring pattern 2 is on it in the opening part 4.

As is shown in FIG. 5, when the underfill material 25 includes the void B in it, expansion or delamination of the underfill material 25 may be caused when the wiring board 10 with the flip-chip mounted semiconductor element 20 is being mounted on a motherboard or the like by water-vapor expansion due to moisture contained in the void B during a reflow soldering process; and it may cause conducting failure at the connecting areas of the convex shaped external connecting terminals 21.

Further, when the void B is formed near the convex shaped external connecting terminals 21 of the semiconductor 20, the moisture or impurities contained in the void B can affect a leakage current flowing between the adjacent terminals of the convex shaped external connecting terminals 21, and it may cause a degradation of the device characteristics or operating failure of the semiconductor device.

Thus, when the underfill material 25 contains the void B, it is possible that the reliability of the semiconductor device will be degraded.

More particularly, with increasing integration of the semiconductor element 20, the pitch of plural convex shaped external connecting terminals 21 of the semiconductor element 20 becomes smaller; the size of the convex shaped external connecting terminals 21 becomes smaller and decreases the formed height, along with bonding electrodes 3 and the wiring pattern of the wiring board 10. As a result, the heights of the steps a and b (see FIG. 2) in the opening part 4 of the wiring board 10 become more fine and it becomes easier for void B to be trapped in the underfill material 25.

Further, even in the conventional case when such difficulty does not arise from the size of the void B, such difficulty is highly likely to arise when the pitch of plural convex external connecting terminals 21 of the semiconductor element 20 becomes smaller.

When the formed height of the convex shaped external connecting terminals 21 becomes shorter, the gap between the semiconductor element 20 and the wiring board 10 becomes smaller, so that the underfill material 25 becomes thinner. Then, for a size of the void B that does not cause a problem in the conventional case, the same size in the increasing integration leads a larger ratio of the void B to the formed thickness of the underfill material 25; as a result, the problem above becomes likely to happen.

Then, the present invention was made considering the related points above. When an adhesive material is provided into an opening part of an insulating resin layer that is formed on a wiring board, the present invention provides for the adhesive material to flow easily into an exposed part of the substrate material near the wiring pattern in the opening part; it prevents forming a void near the edge of the opening part of the substrate material exposed; even if a void is formed, it provides a wiring board, a mounting structure of electronic components, and semiconductor device having a structure that makes it easier to remove the void.

SUMMARY OF THE INVENTION

According to one embodiment of a embodiment, a wiring board is provided that includes a plurality of external connecting terminals formed on a main surface where an electronic component is mounted face down (in a face-down manner), the electronic component is solidified on the wiring board with an adhesive, an insulating layer is formed on the surface on which the electronic component is mounted, a plurality of adjacent wiring patterns connect to the plural external connecting terminals of the electronic component, and an opening part is formed in the insulating layer; wherein the opening part is formed to partially and commonly open on the plural adjacent wiring patterns, and an edge of the opening part is in a central side of a peripheral part of the opening part (i.e., an edge of the opening part is toward a central part of the wiring board), wherein the edge is formed in an oblique direction against an extendable direction (an extending direction) of the plural adjacent wiring patterns.

According to another aspect the embodiment, a mounting structure of an electronic component is provided that includes a plurality of external connecting terminals formed on a main surface where an electronic component is mounted face down (in a face-down manner), the electronic component is solidified on the wiring board with an adhesive, an insulating layer is formed on the surface on which the electronic component is mounted, a plurality of adjacent wiring patterns connect to the plural external connecting terminals of the electronic component, and an opening part is formed in the insulating layer; wherein the opening part is formed to partially and commonly open on the plural adjacent wiring patterns, and an edge of the opening part is in a central side of a peripheral part of the opening part (i.e., an edge of the opening part is toward a central part of the wiring board), wherein the edge is formed in an oblique direction against extendable directions of the adjacent wiring patterns.

According to another aspect of the embodiment, a semiconductor device is provided that includes a plurality of external connecting terminals formed on a main surface where an electronic component is mounted face down (in a face-down manner), and the electronic component is solidified on the wiring board with an adhesive, an insulating layer is formed on the surface on which the electronic component is mounted, a plurality of adjacent wiring patterns connect to the plural external connecting terminals of the electronic component, and an opening part formed in the insulating layer; wherein the opening part is formed to partially and commonly open on the plural adjacent wiring patterns, and an edge of the opening part is in a central side of a peripheral part of the opening part (i.e., an edge of the opening part is toward a central part of the wiring board), wherein the edge is formed in an oblique direction against extendable directions of the plural adjacent wiring patterns.

DETAILED DESCRIPTION OF THE PREFERED EMBODIMENTS

A description is given below, with reference to the FIG. 6 through FIG. 24 of embodiments of the present invention.

Figure 6:
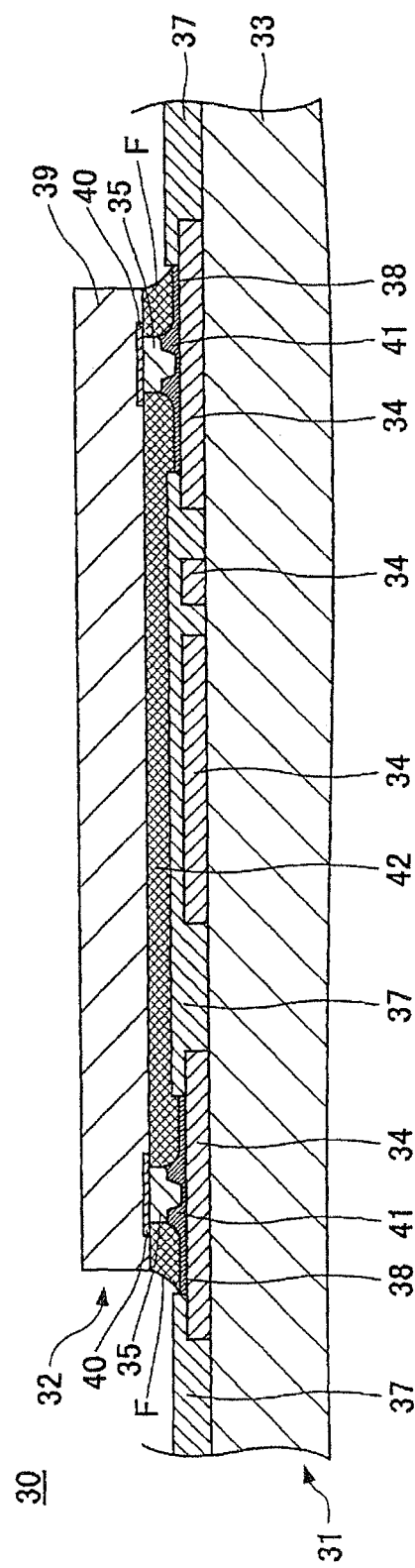
FIG. 6 is an illustrative drawing related to a first embodiment of the present invention and showing major portions of a structure for a semiconductor element mounted onto a wiring board.

First, FIG. 6 is an illustrative drawing related to a first embodiment of the present invention and showing major portions of a structure for a semiconductor element mounted onto a wiring board.

Referring to FIG. 6, a semiconductor device 30 includes a semiconductor integrated circuit device ("semiconductor element") 32 flip-chip (face-down) mounted on and connected to one main (top) surface of a wiring board 31.

Figure 7:
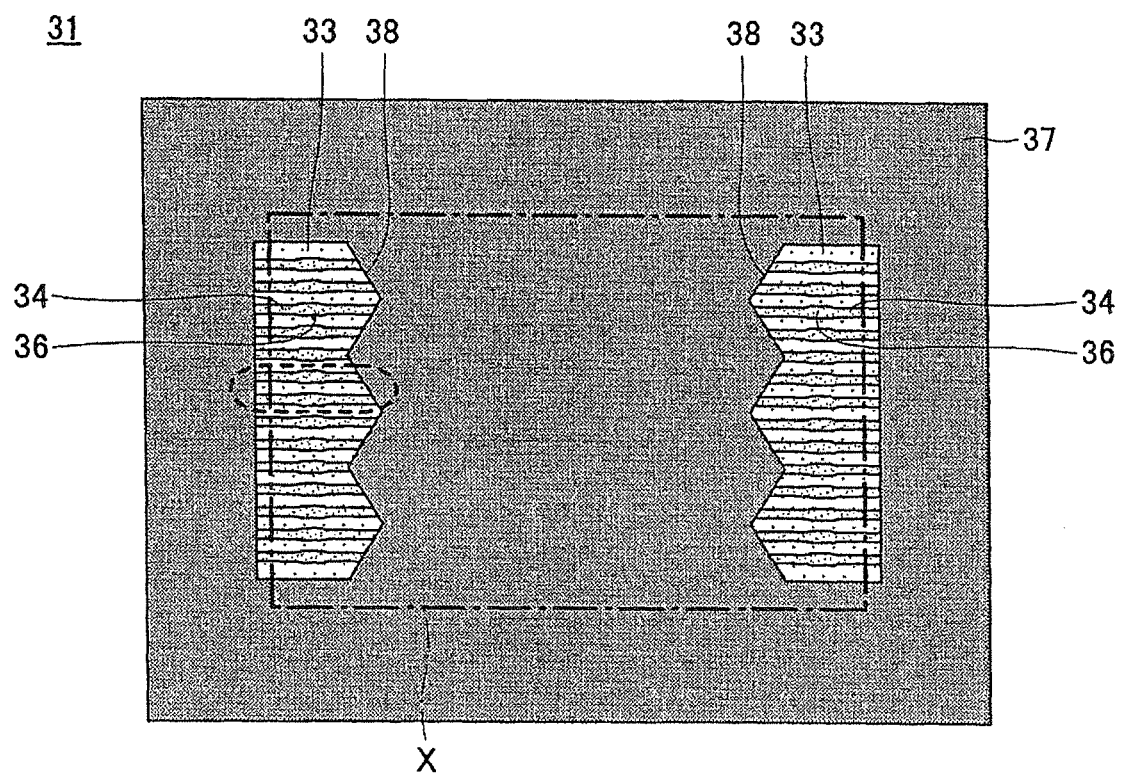
FIG. 7 is an illustrative drawing showing a plan view of a structure of the wiring board of FIG. 6.

For a detailed description of the structure of the wiring board 31, refer to FIG. 7 as well. FIG. 7 is an illustrative drawing showing a cut-away plan view of the structure of the wiring board of FIG. 6. Then, a dashed line X in FIG. 7 indicates the outer area of the semiconductor element 32 (see FIG. 6) to be mounted faced down on the wiring board 31.

The wiring board 31 is provided with a substrate material 33 that is glass epoxy resin, glass-BT (glass-bismaleimide-triazine), polyimide such as organic insulating resin, or inorganic matter such as ceramic or glass, and the surface includes wiring patterns 34 that are made of copper (Cu) and selectively arranged on it. The wiring board 31 is called an interposer or a supporting substrate.

To part of the main surface of the wiring board 31 on which the semiconductor element 32 is mounted, a solder resist layer (an insulating resin layer) 37, made of resin, such as epoxy type, acryl type, polyimide type or a compound of these, is selectively provided, except for bonding electrodes 36 and their surrounded areas, where projection shaped (stud bump shape) external connection terminals 35 (see FIG. 6) of the semiconductor element 32 are connected.

Openings 38 are partially formed in the solder resist layer 37, where adjacent plural wiring patterns 34 are commonly partially exposed.

The wiring patterns 34 are linearly extensively formed in the openings 38. As the wiring patterns 34 are linearly formed and exposed in the openings 38, underfill material 42 mentioned later, is supplied to flow smoothly along the wiring patterns 34 when the underfill material 42 is provided in the openings 38, and even if bubbles are caused in the underfill material 42, the voids are easily removed during the flowing.

Further, in parts of the wiring patterns 34 exposed in the openings 38, the bonding electrodes 36 are provided. The arranged direction of the individual bonding electrodes 36 is almost perpendicular to the extended direction of the wiring patterns 34.

As described later by referring to FIG. 6, as predetermined (e.g. along the four sides or near the four sides of a main plane surface or along two sides or near two facing sides), electrode pads 40 are arranged almost in line for the external connecting terminals 35 on the main plane surface of a semiconductor substrate 39 of the semiconductor element 32 to be flip-chip mounted on the wiring board 31 (in the present example, on the plane surface of the semiconductor 39, along two sides or near two facing sides, the electrode pads 40 are arranged in a row for the external connecting terminals 35).

Thus, the extensional direction of the wiring patterns 34, exposed in the openings 38, matches with the direction to the outer side of the semiconductor 32, so that even if voids are formed in the underfill material 42, it is easy to remove them.

The width of bonding electrodes 36 are formed to be wider than that of a wiring pattern 34, except where the wiring patterns 34 are in the vicinity of the bonding electrodes 36.

Thus, when a semiconductor element 32 is flip-chip mounted onto the wiring board 31, it can reduce connecting failures and increase the manufacturing yield, wherein the connecting failures are caused by misalignment between projection shape external connecting terminals 35 of the semiconductor element 32 and the bonding electrodes 36 (the detailed explanation is made later).

The solder resist layer 37 is provided on the wiring board 31, for example, with a light sensitive photoresist material by a printing method, a spray coating method, or a lamination method using a thermal roll.

Further, the openings 38, for example, are formed partly on the solder resist layer 37 by using the lithography method.

In the present embodiment, the openings 38 are formed on the wiring board 31 so that the peripheral parts of the openings 38 are formed outside of the peripheral region X of the semiconductor element 32. Thus, even if voids are formed in the underfill material 42, the voids are easily removed from it. Further, the edges of the openings 38 play as dams for the fluid flow of the underfill material 42, and then the shape of a fillets F (see FIG. 6, described in detail later) can be controlled easily.

Further, in the present embodiment, the outer sides of the openings 38 where the semiconductor element 32 is positioned on the peripheral part of the openings 38, are formed almost in parallel to the arranged direction of the bonding electrodes 36. In contrast, the parts near the central side of the openings 38 are formed in different directions to the arranged direction of the bonding electrodes 36, that is, not in parallel to the arranged direction of the bonding electrodes 36, with a predetermined angle like saw teeth having a zigzag shape.

For the wiring board 31, there are one main plane surface on which the semiconductor element 32 is mounted and the opposite main plane surface on which a conducting layer is formed (not shown). On the conducting layer, external connecting terminals (not shown in FIG. 6 and FIG. 7), consisting of spherical shaped electrode terminals containing dominantly solder, are plurally formed in grid-like fashion.

The semiconductor element 32 (see FIG. 6) is fabricated by conventional semiconductor manufacturing processes using a silicon (Si) semiconductor substrate 39.

On one main plane surface of the semiconductor substrate 39, with selectively (e.g. along the four sides or near the four sides of the main plane surface or along two sides or near two facing sides), the electrode pads 40 for the external connecting terminals 35 are provided in line.

(For the present embodiment, on the one plane surface of the semiconductor 39, along the two sides or near the two facing sides, electrode pads 40 are arranged in a row for the external connecting terminals 35).

Further, on the electrode pads 40, projection shaped (convex shape) external connecting terminals 35, named as wire bumps, are provided.

For the semiconductor element 32, drawings to indicate the following elements are omitted; active devices such as transistors, or passive devices such as capacitors fabricated in the silicon substrate 39, and multiple wiring layers as well as rewiring layers formed on the other main plane surface.

The electrode pad 40 for the external connecting terminal is fabricated with aluminum (Al), copper (Cu), alloys of those or the like. The exposed surface (top layer) of the electrode pad 40 may include a gold (Au) layer formed by the electrolytic metal plating method or the vapor deposition method.

Further, on the projection shaped external connecting terminal 35 formed on the electrode pad 40, a gold ball is press bonded and connected, and a pedestal part is formed by such as the ball bonding method using the wire-bonding method. Further, a projection of the external connecting terminal 35, projecting on the pedestal part, is jointly formed. The top of the projection external connecting terminal 35 is made planar when necessary.

Thus, the projection external connecting terminal 35 is not limited to the above example, i.e. copper (Cu), an alloy of copper (Cu) and gold (Au), or solder may be used instead of gold.

Figure 8:
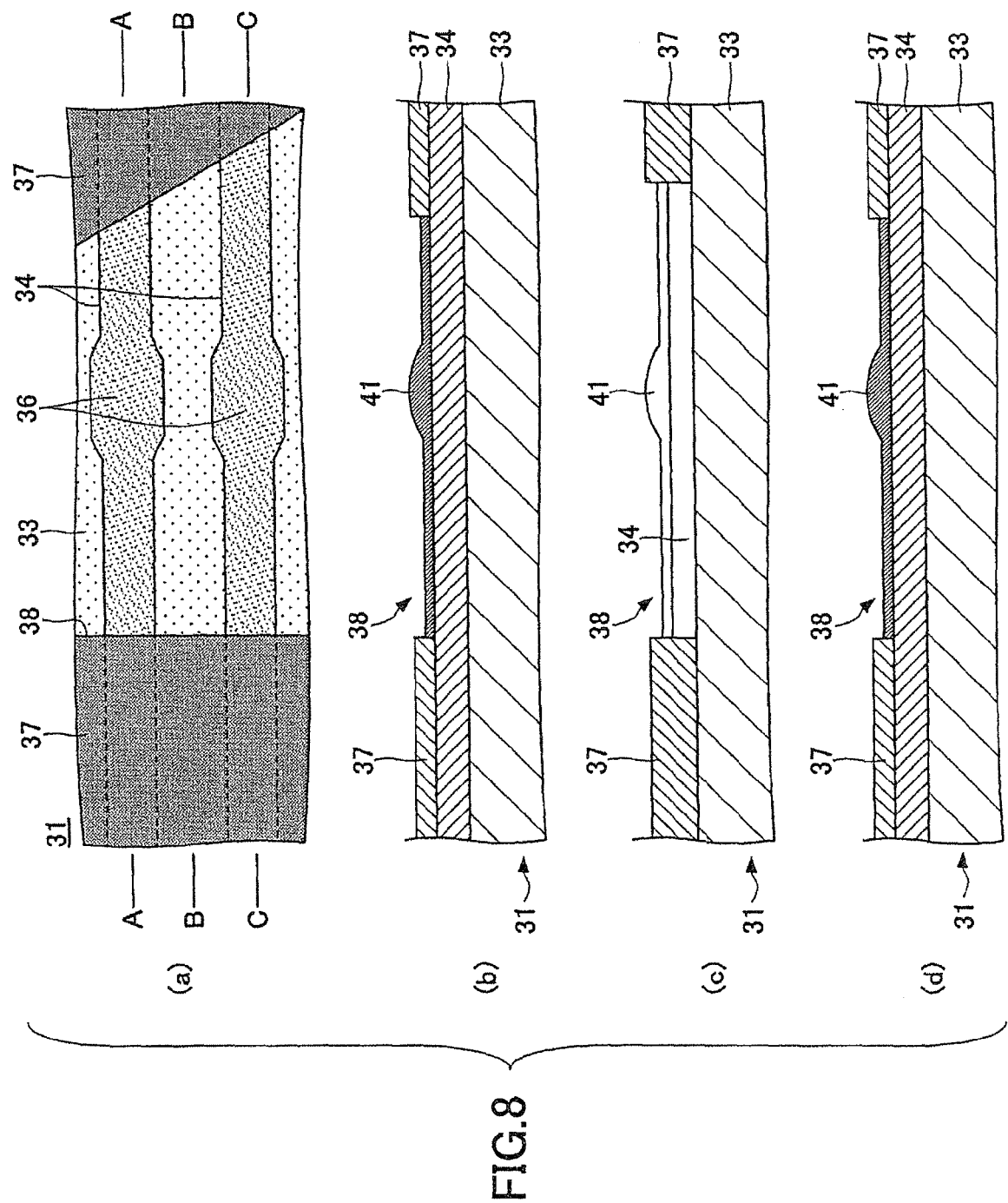
FIG. 8 is an illustrative drawing showing the structure of the portion indicated by a broken oval line in FIG. 7.
Figure 9:
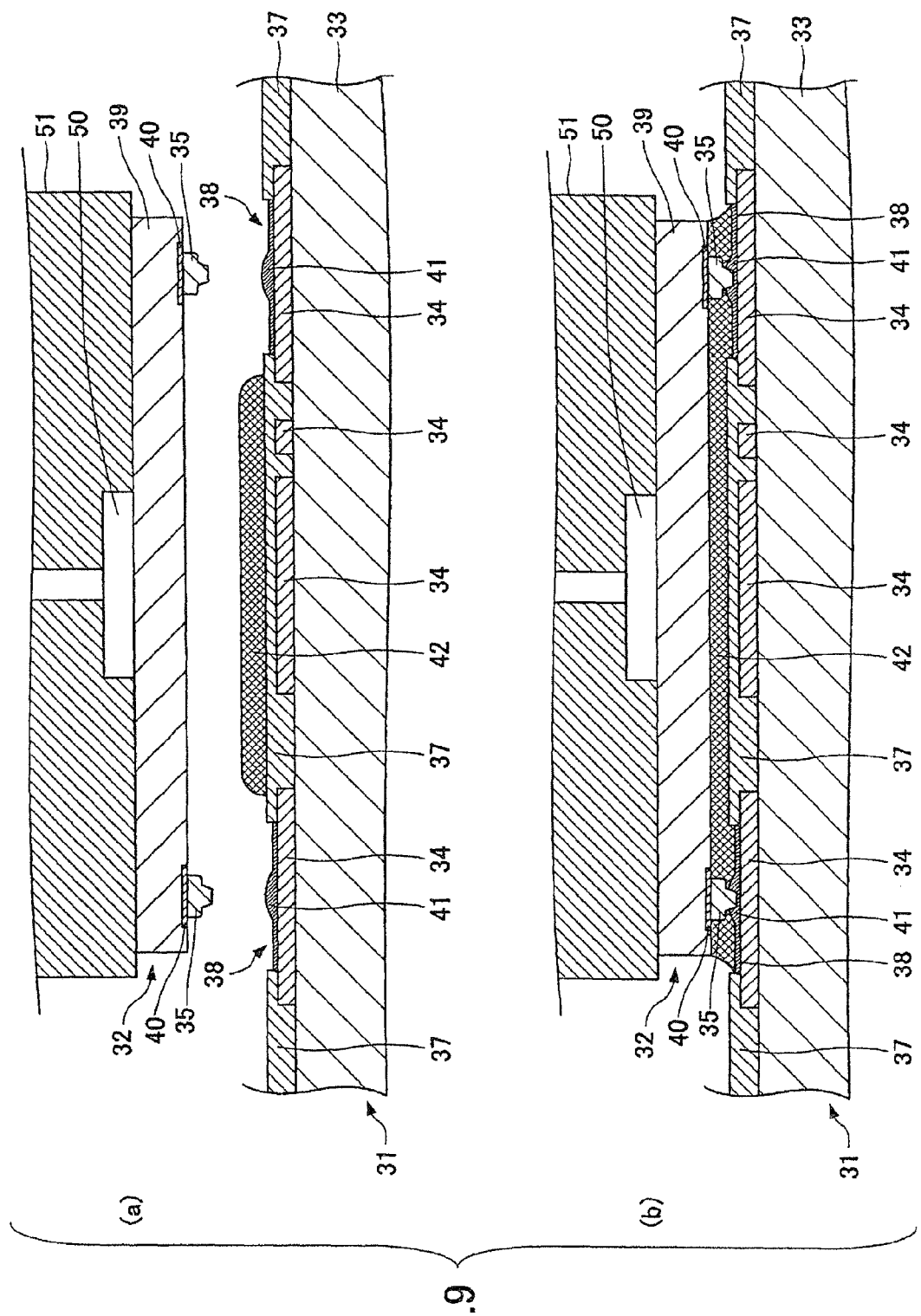
FIG. 9 is an illustrative drawing showing a flip-chip mounting process for mounting a semiconductor element onto the wiring board in FIG. 7.
Figure 10:
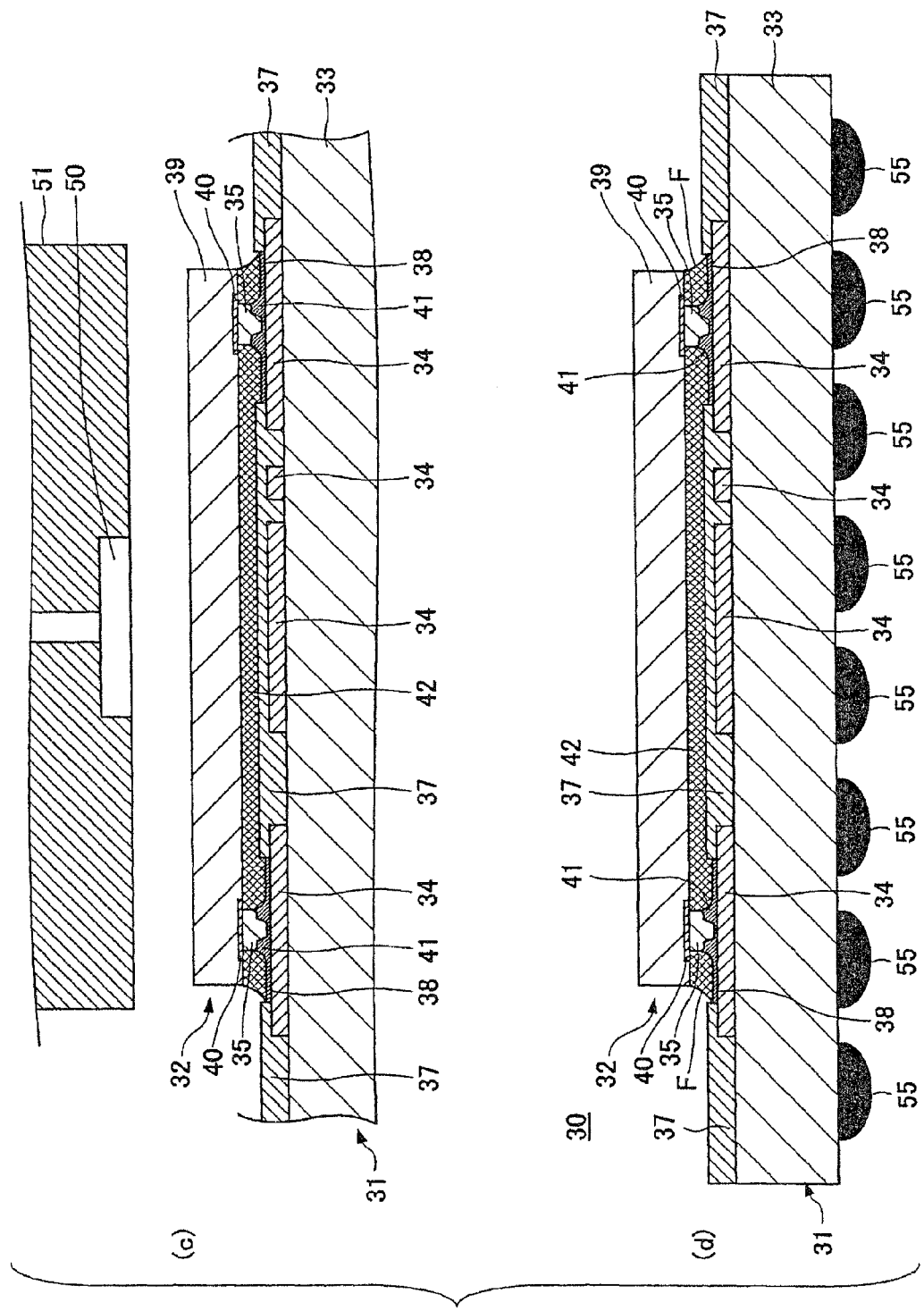
FIG. 10 is an illustrative drawing showing a flip-chip mounted semiconductor device with a semiconductor element that has been mounted on it.

As described above, the projection external connecting terminal 35 of the semiconductor element 32 is connected to the bonding electrode 36 on the wiring pattern 34 of the wiring board 31. As shown in FIG. 8, a re-meltable conducting material 41 consisting of solder, conductive resin, or the like is provided on the wiring pattern 34. FIG. 8 shows the structure of the part encompassed by a broken line in FIG. 7, (a) is an enlarged plan view of the part, (b) is a cross-sectional view at the line A-A of (a), (c) is a cross section at the line B-B of (a), and (d) indicates the cross section at the line C-C of (a).

As shown in FIG. 8, for the opening part 38 of the solder resist layer 37, the part positioned at the outer side of the wiring board 31 is formed almost parallel to the arranged direction of the bonding electrode 36, and the part located at inner side of the wiring board 31 is formed in a different direction from the arranged direction of the bonding electrodes 36, i.e. it is formed in an oblique direction against the arranged direction of the bonding electrodes 36.

In the opening 38 with such a shape, the conducting material 41 is adjacently provided on the wiring pattern 34 with a predetermined distance. On the other hand, the substrate material 33 of the wiring board 31 is exposed at parts between the adjacent wiring patterns 34.

The conducting material 41 is formed on the wiring pattern 34 by using the printing method, the transferring method, the vapor deposition method, the chemical reaction method, or the like.

As shown in FIG. 6, on the projection shaped external connecting terminals 35 of the semiconductor element 32, at least the projection part and its corresponding bonding electrode 36 are commonly covered and mechanically an electrically connected by the conducting material 41. Thereby, a highly reliable mounting structure can be formed for the wiring board 31 and the semiconductor element 32. Further, the conducting material 41 may not be provided, wherein the projection external connecting terminals 35 of the semiconductor 32 are directly connected to the bonding electrode 36.

Further, the gap between the semiconductor element 32 and the one main plane (top plane) surface of the wiring board 31 is filled with such as epoxy resin, acryl resin, silicone resin, or the underfill material 42 which is adhesive of another thermal solidified insulating resin. Further, the underfill material 42 may contain small conducting particles, such as silver (Ag), solder, nickel (Ni) or the like.

Thus, the semiconductor 32 is flip-chip mounted on and connected to the one main plane surface of the wiring board 31.

The following describes the processing sequence of flip-chip mounting the semiconductor element 32 onto the wiring board 31 to achieve the structure described above.

The present example shows that when the semiconductor element 32 is mounted on the wiring board 31, the underfill material 42 is preliminary supplied on the wiring board 32, that the underfill material 42 is spread out by the semiconductor element 32 being mounted on the wiring board 31 with the supplied underfill material 42, and that the underfill material 42 is spread all over the region under the semiconductor element 32 by the capillary effect. Successively, the underfill material 42 is solidified by heat that is provided when the semiconductor 32 is mounted on the wiring board 31.

First, as shown in FIG. 9(a), the wiring board 31 is mounted and fixed on a bonding stage (not shown). Further, on the central side of the solder resist layer 37 of the wiring board 31 is put on the underfill material 42 in paste form by using a dispensing method.

Then, by heating the bonding stage described above, the temperature of the wiring board 31 may be raised to about 50° C. or about 100° C. Thereby, the viscosity of the underfill material 42 applied on the wiring board 31 becomes lower, increasingly the fluidity of the underfill material 42 for succeeding processes.

Further, the conducting material 41 is preliminarily deposited and formed on the wiring patterns 34 of the wiring board 31 by using a printing method, a transferring method, a vapor deposition method, a chemical reaction method or the like.

Then, the semiconductor element 32 is held with a sticking tool 51 having a suction hole 50, wherein the main plane surface of the semiconductor element 32 is made parallel to the main plane surface of the wiring board 31, and the plane surface having the projection external connecting terminals 35 is face down (in a face-down manner).

The sticking tool is preliminarily heated to a predetermined temperature by a heating method (not shown), such as about 180° C. or about 260° C. that is over the melting point of the conducting material 41. That is followed by lowering the sticking tool 51 and making contact by the projection parts of the projection external connecting terminals 35 of the semiconductor element 32 with the conducting material 41 provided on the wiring patterns 34 (see FIG. 7), and applying a force to the conducting material 41 using the sticking tool 51 and melting it.

As a result, the conducting material 41 covers at least the projection parts of the projection external connecting terminals 35, and with the conducting material 41, the projection external connecting terminals 35 of the semiconductor element 32 are connected with the bonding electrodes 36 of the wiring board 31 (see FIG. 7).

Further, in the sequence of which the projection external connecting terminals 35 are connected to the conducting material 41, the underfill material 42 provided on the wiring board 31 is spread out by the semiconductor element 32, flows through the gap between the semiconductor element 32 and the wiring board 31, and consequently, it flows all over the peripheral region of the semiconductor element 32 by capillary effect; then it is solidified by the heat of the sticking tool 5. However, the underfill material 42 needs to not be completely solidified in the present process.

Thereby, the projection external connecting terminals 35 of the semiconductor element 32 are connected to the bonding electrodes 36 (see FIG. 7) of the wiring board 31, and the semiconductor element 32 is fixed to the wiring board 31 with the underfill material 42 and the connection is maintained. Such a condition is shown in FIG. 9(b).

In the present process, the force applied by the sticking tool 51 is dependent upon the material characteristics or the structure of the projection external connecting terminals 35 of the semiconductor element 32 and the bonding electrodes 36 (see FIG. 7) of the wiring board 31, its flip-chip mounting method, or the like. For example, the force applied may be about 1 gf or about 140 gf to one of the projection external connecting terminals 35. Further, in the present process, in addition to a force and heating, a method of applying ultrasonic waves or a method of applying a force and ultrasonic waves without heating may be used.

Figure 11:
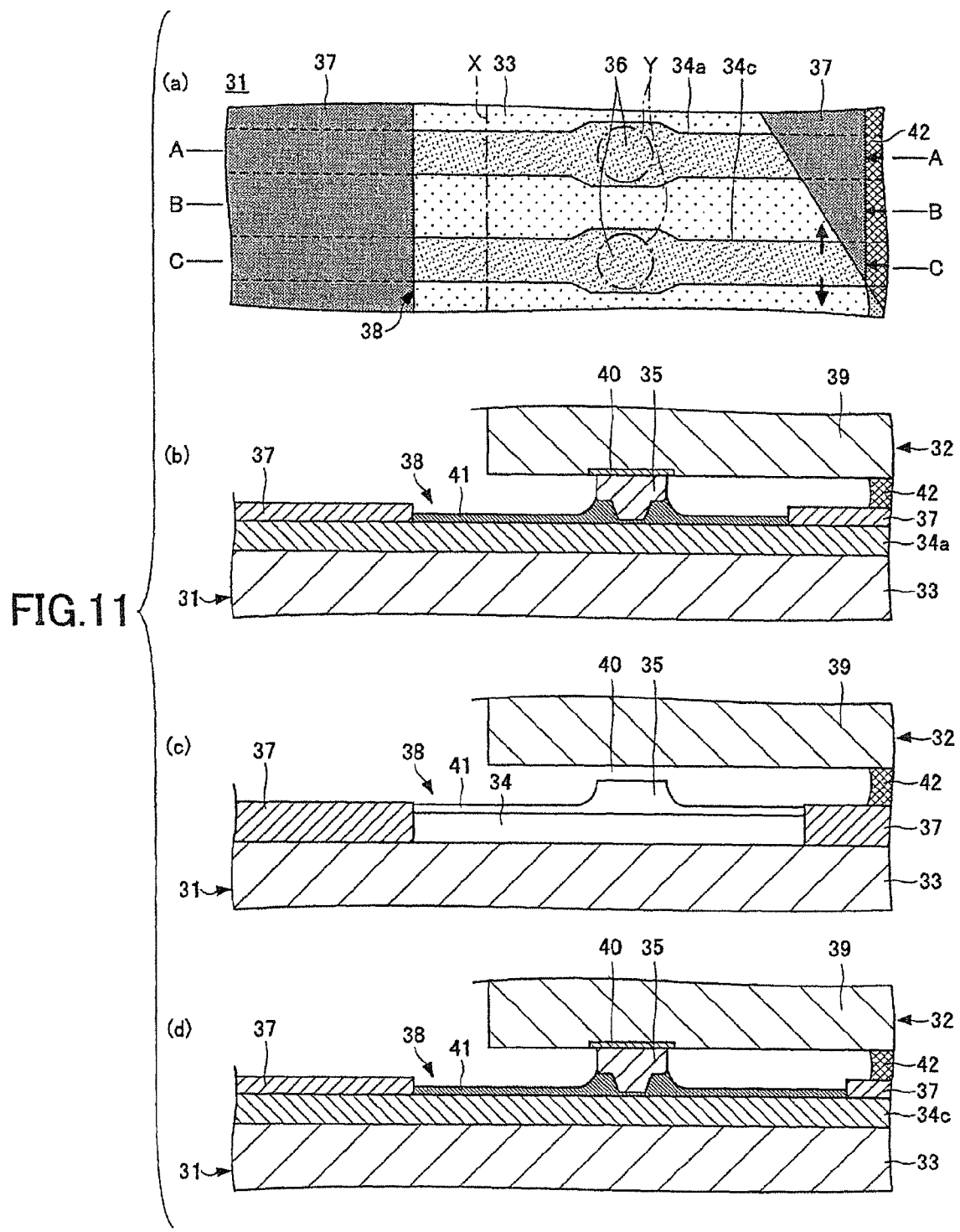
FIG. 11 is an illustrative drawing (case 1) showing a flow of an underfill material in a flip-chip mounting process for mounting a semiconductor element onto the wiring board in FIG. 7.
Figure 14:
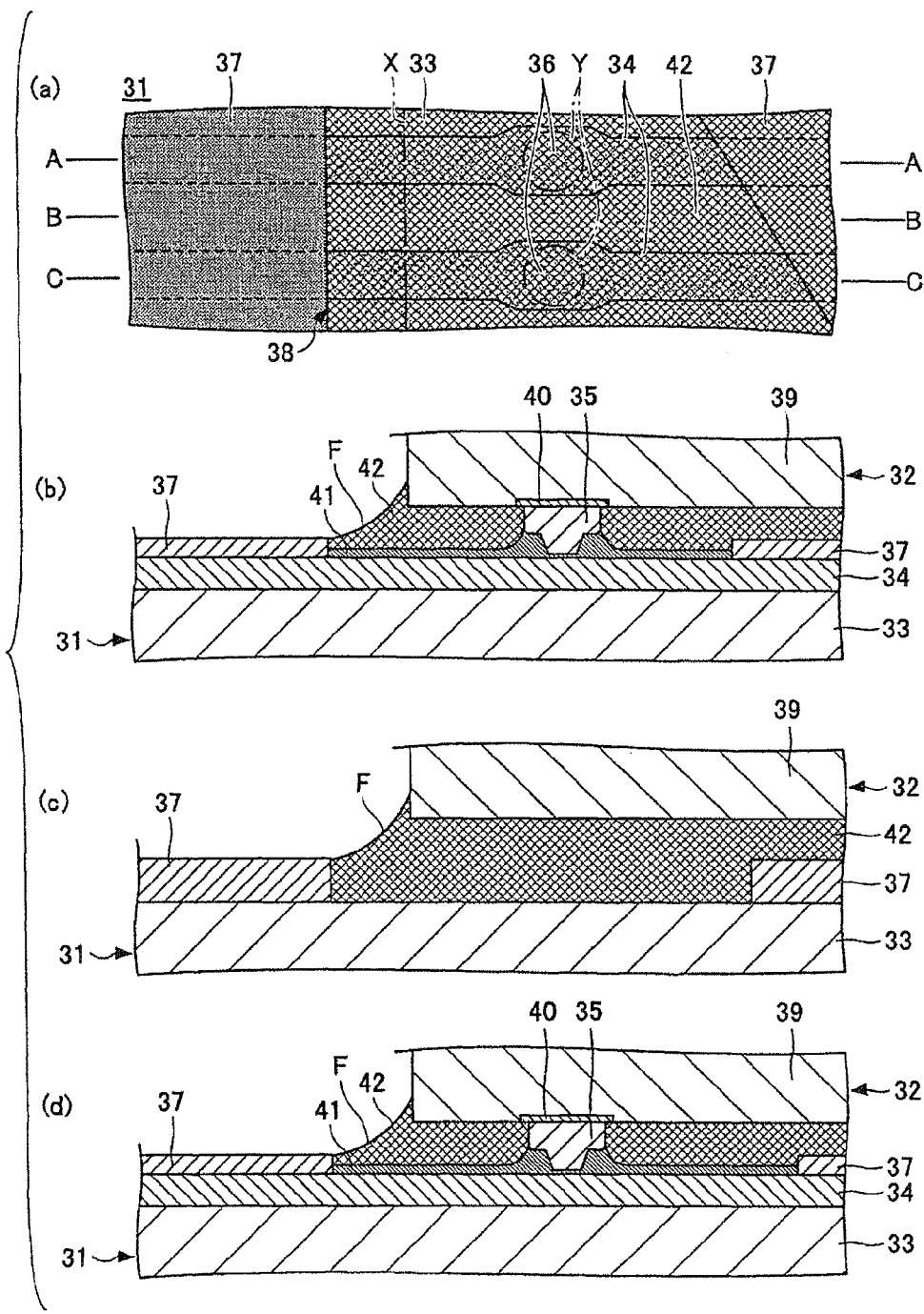
FIG. 14 is an illustrative drawing (case 4) showing a flow of an underfill material in a flip-chip mounting process for mounting a semiconductor element onto the wiring board in FIG. 7.

Further, the fluid flow is explained for the present process where the underfill material 42 is provided on the solder resist layer 37 of the wiring board 31 by referring to FIG. 11 or FIG. 14.

In each of FIG. 11 and FIG. 14, (a) shows an enlarged view of the part encompassed with a broken line in FIG. 7, (b) shows a cross-sectional view of the part indicated by a line A-A of (a),(c) shows a cross-sectional view of the part indicated by a line B-B of (a), and (d) shows a cross-sectional view of the part indicated by a line C-C of (a).

Further, in (a), the alternate long and short dash line X indicates the peripheral area of the semiconductor element 32 to be mounted face down (in a face-down manner) on the wiring board 31. The other dashed line Y indicates the peripheral area of the external connecting terminal 35 of the semiconductor 32 (see FIG. 9) on the bonding electrodes 36 of the wiring board 31.

Figure 12:
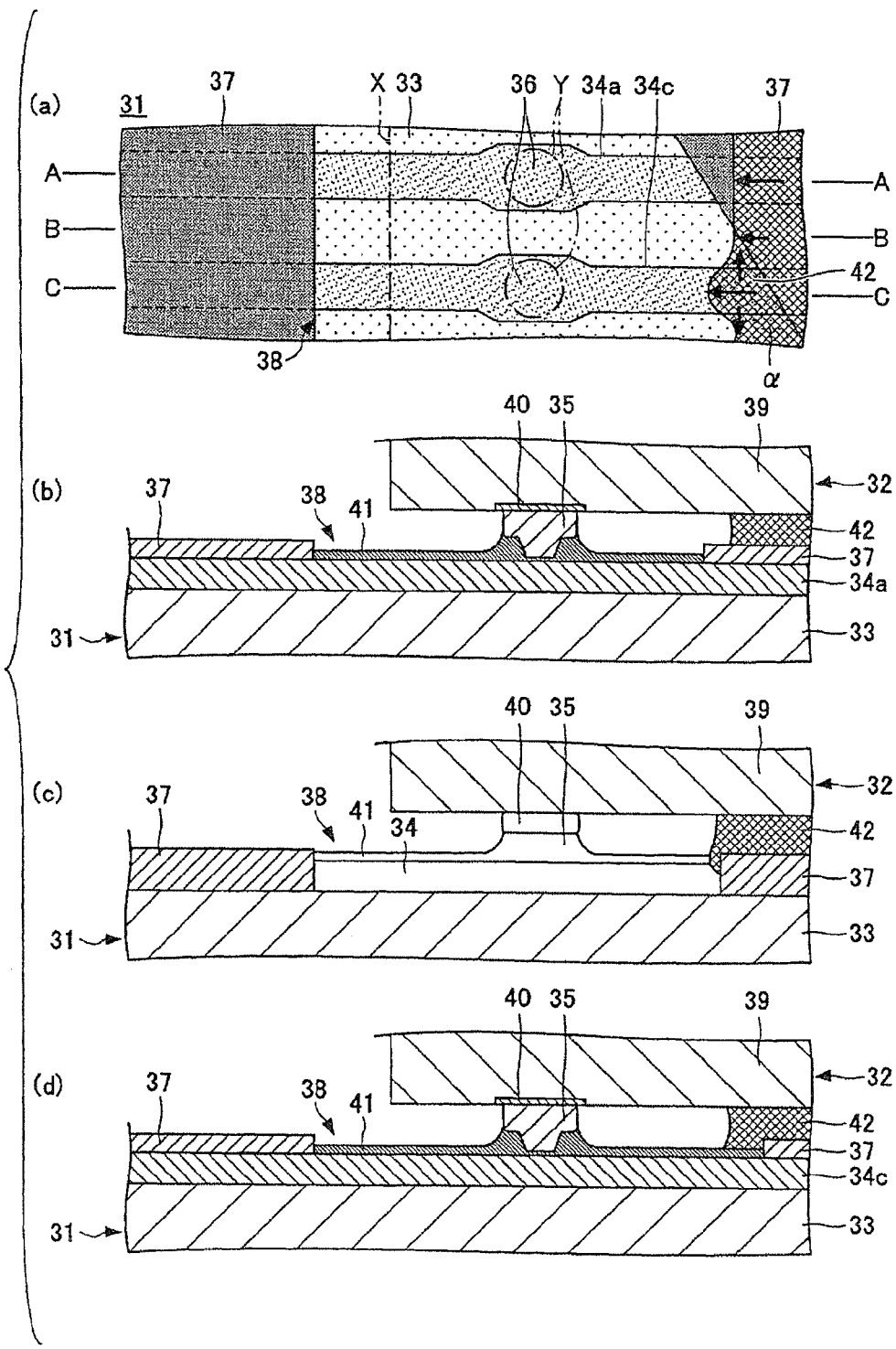
FIG. 12 is an illustrative drawing (case 2) showing a flow of an underfill material in a flip-chip mounting process for mounting a semiconductor element onto the wiring board in FIG. 7.
Figure 13:
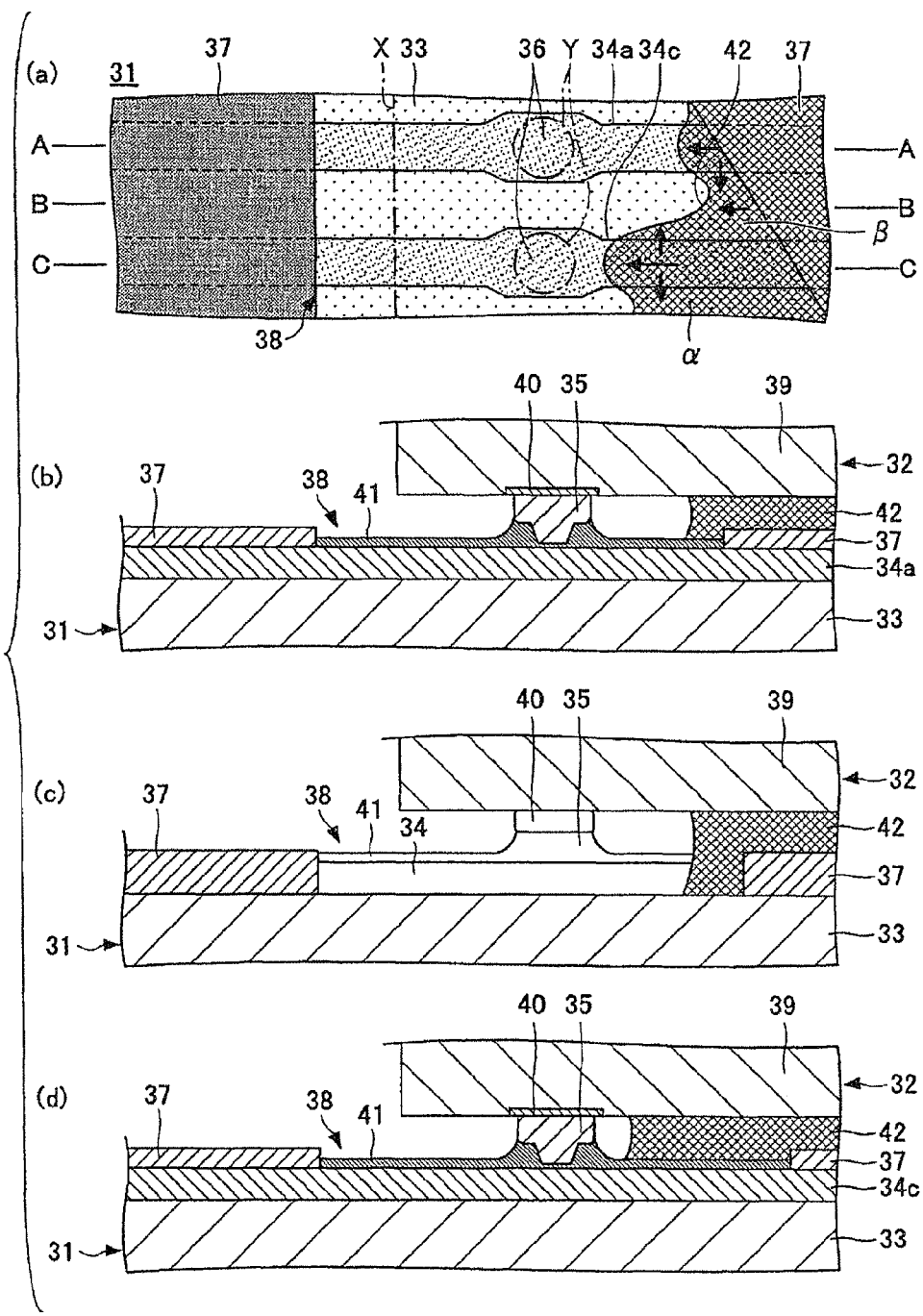
FIG. 13 is an illustrative drawing (case 3) showing a flow of an underfill material in a flip-chip mounting process for mounting a semiconductor element onto the wiring board in FIG. 7.

Further, the arrows in FIG. 11 through FIG. 13 indicate the flow directions of the underfill material 42.

In the process shown in FIG. 9(a), when the sticking tool 51 holding the semiconductor element 32 is lowered, and starts applying a force, the underfill material 42, provided on the solder resist 37 of the wiring board 31, starts flowing from an almost central part of the wiring board 31 to the outer side of it.

With the time of processing, the underfill material 42 continuously flows forward due to press spreading due to the sticking tool 51 and the capillary effect. For the peripheral region of the opening 38 of the solder resist layer 37, the part of the peripheral region, closer to the central part of the wiring board 31 is formed in a direction different from the arranged direction of the bonding electrodes 36, that is, the part of the peripheral region is not in parallel to the arranged direction of the bonding electrodes 36. Thus, the underfill material 42 starts flowing into a region that is closer to the central part of the wiring board 31.

Further, as shown in FIG. 12, with progressing the process, the underfill material 42 flowing over the adjacent wiring pattern 34c moves faster than the underfill material 42 flowing over the substrate material 33 (indicated as a in FIG. 12) of the wiring board 31.

The distance between the wiring pattern 34 and the underfill material 42 flowing over the solder resist layer 37 is shorter than that between the substrate material 33 (no wiring pattern 34) of the wiring board 31 and the underfill material 42 flowing over the solder resist 37. In general, since the wetness rate of a fluid adhesive on metal is faster than that on a resin surface, the underfill material 42, flowing over the adjacent wiring pattern 34c moves faster than that flowing over the substrate material 33 (indicated as α in FIG. 12) of the wiring board 31.

Further, with time advancing, as shown in FIG. 13, the fluid flow of the underfill material 42 on the wiring pattern 34c of the wiring board 31 indicated by α in FIG. 13, moves forward, and a different part of the underfill material 42 on the substrate material 33 of the wiring board 31 (indicated by β in FIG. 13), having arrived later than that on the wiring pattern 34c, and another part of the underfill material 42 on the wiring pattern 34a adjacent to the wiring pattern 34c, having arrived further later on it through the part indicated by β in FIG. 13, moves forward.

At this point, within the area encompassed with a broken line in FIG. 7, the underfill material 42 flowing on the wiring pattern 34c is the most advancing flow front.

Further, for the reason described above, the underfill material 42, having reached the adjacent wiring pattern 34a later than that on the substrate material 33 (indicated by β in FIG. 13) on the wiring board 31, flows faster than the underfill material 42 on the substrate material 33 (indicated by β in FIG. 13) of the wiring board 31, so that the underfill material 42 flowing on the wiring pattern 34a has moved slightly forward compared to the underfill material 42 flowing on the substrate material 33 (indicated by β in FIG. 13) of the wiring board 31.

Therefore, the underfill material 42 on the substrate material 33 (indicated by β in FIG. 13) of the wiring board 31 moves continuously; in parallel, the underfill material 42 flowing on the wiring pattern 34c flows onto the substrate material 33 (indicated by β in FIG. 13) of the wiring board 31; further, the underfill material 42 flowing behind the underfill 42 flowing on the wiring pattern 34a slightly flows onto the substrate material 33 (indicated by β in FIG. 13) of the wiring board 31.

Figure 1:
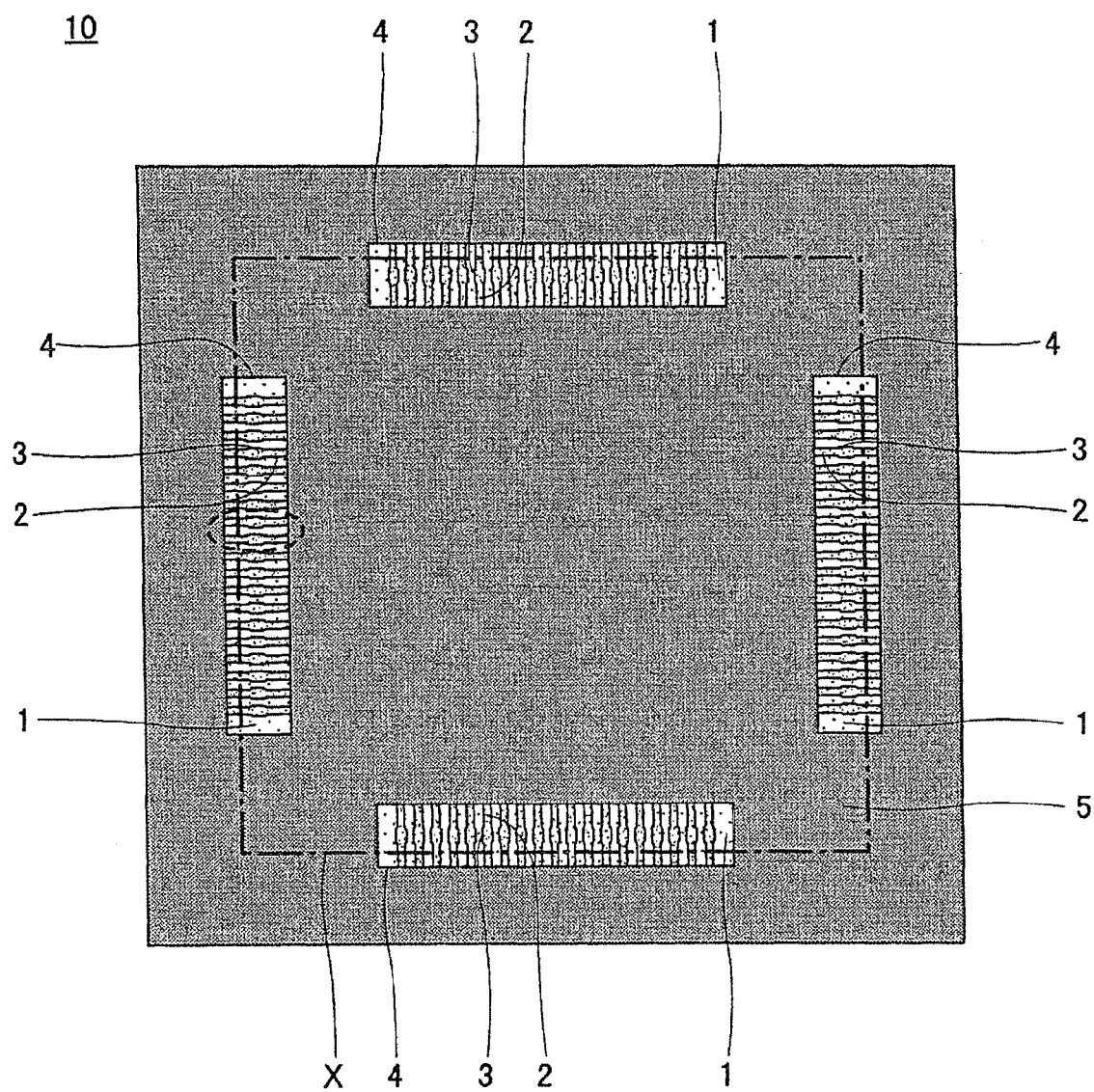
FIG. 1 is an illustrative drawing of a related art case showing a structure of a wiring board to be flip-chip mounted with a semiconductor element.
Figure 2:
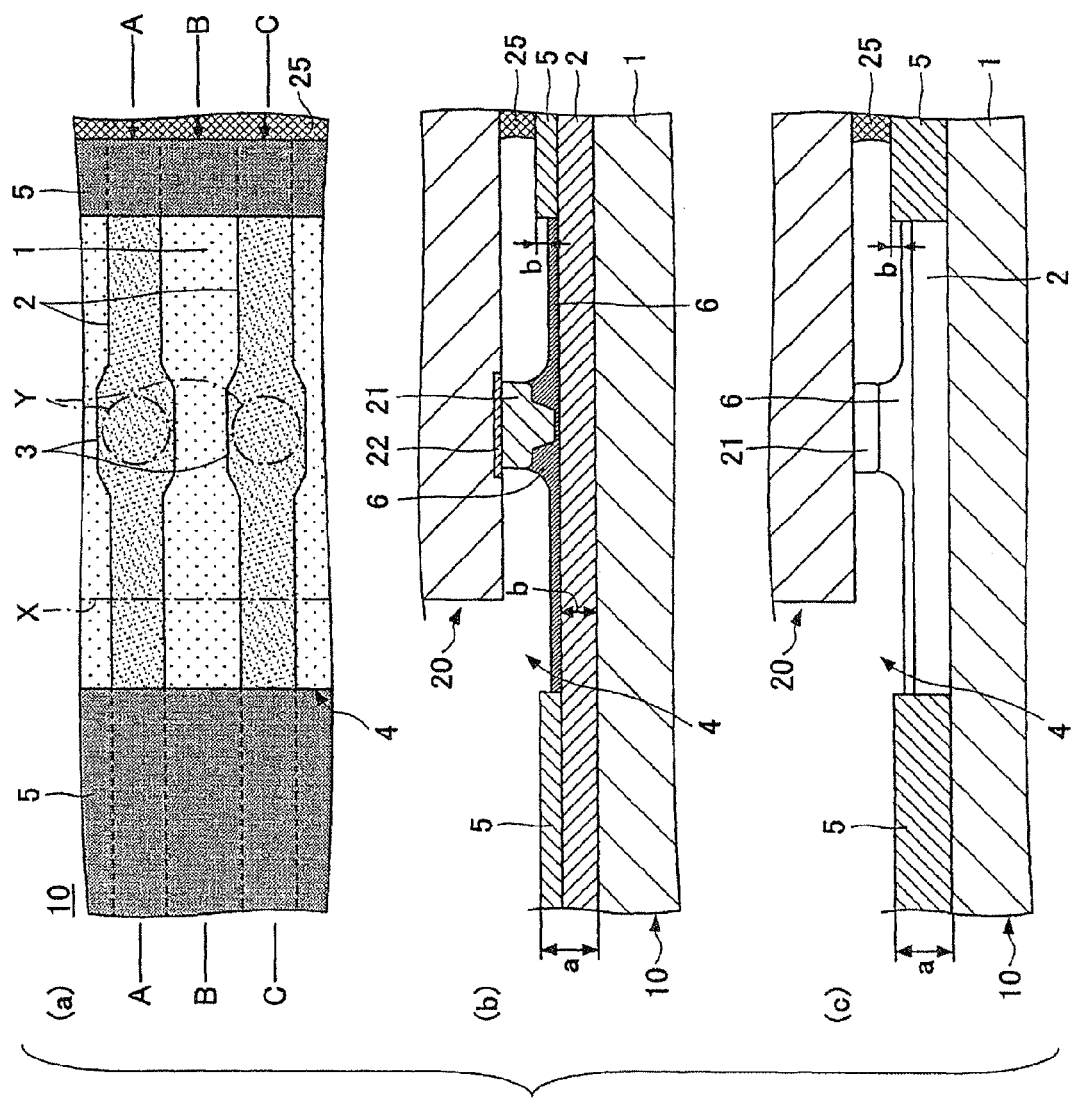
FIG. 2 is an illustrative drawing (case 1) showing a flip-chip mounting process for mounting a semiconductor element onto the wiring board 10 of FIG. 1.
Figure 3:
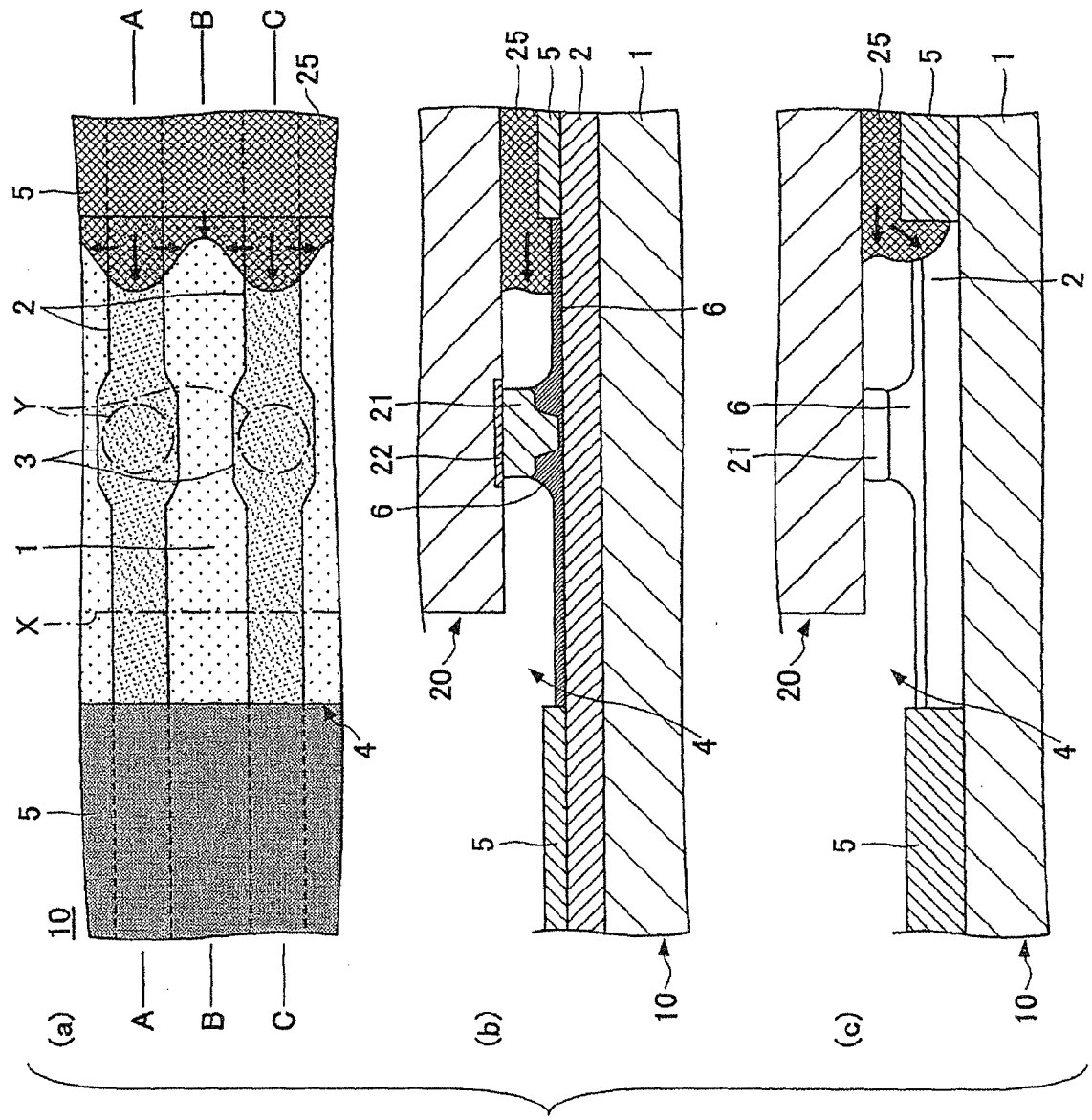
FIG. 3 is an illustrative drawing (case 2) showing a flip-chip mounting process for mounting a semiconductor element onto the wiring board 10 of FIG. 1.

In the conventional structure, as shown in FIG. 3, on the wiring pattern 2, the underfill material 25 flows faster than that on the substrate material 1 of the wiring board 10 with no wiring pattern 2, and, in parallel, the underfill 25 flowing on the wiring pattern 2 flows onto the substrate material 1 of the wiring board 10. Namely, the underfill material 25 flowing on the substrate material 1 of the wiring board 10 flows as if it is pulled by the underfill material flows 25 that are flowing with the same flowing velocity on both sides of the adjacent wiring patterns 2.

While the flow of the underfill material 25 continues, due to a difference in flow velocities of the underfill material flows 25 on two adjacent parts of a part having the wiring pattern 2 and another part having no wiring pattern 2, the void B (see FIG. 4) is likely formed near the edge part of the opening part 4 on the substrate material 1 to be exposed and adjacent to the wiring pattern 2 in the opening part 4.

Figure 4:
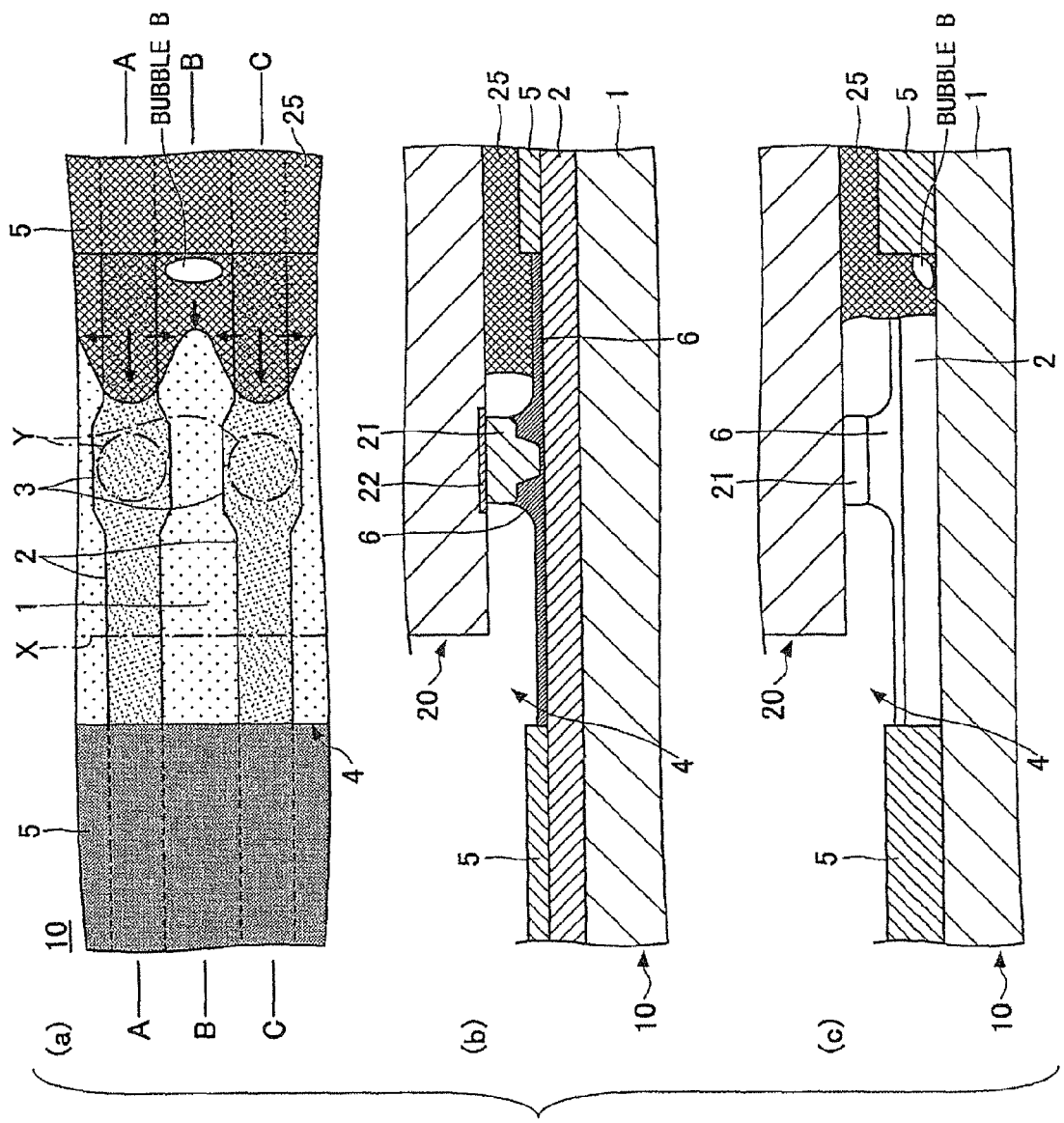
FIG. 4 is an illustrative drawing (case 3) showing a flip-chip mounting process for mounting a semiconductor element onto the wiring board 10 of FIG. 1.
Figure 5:
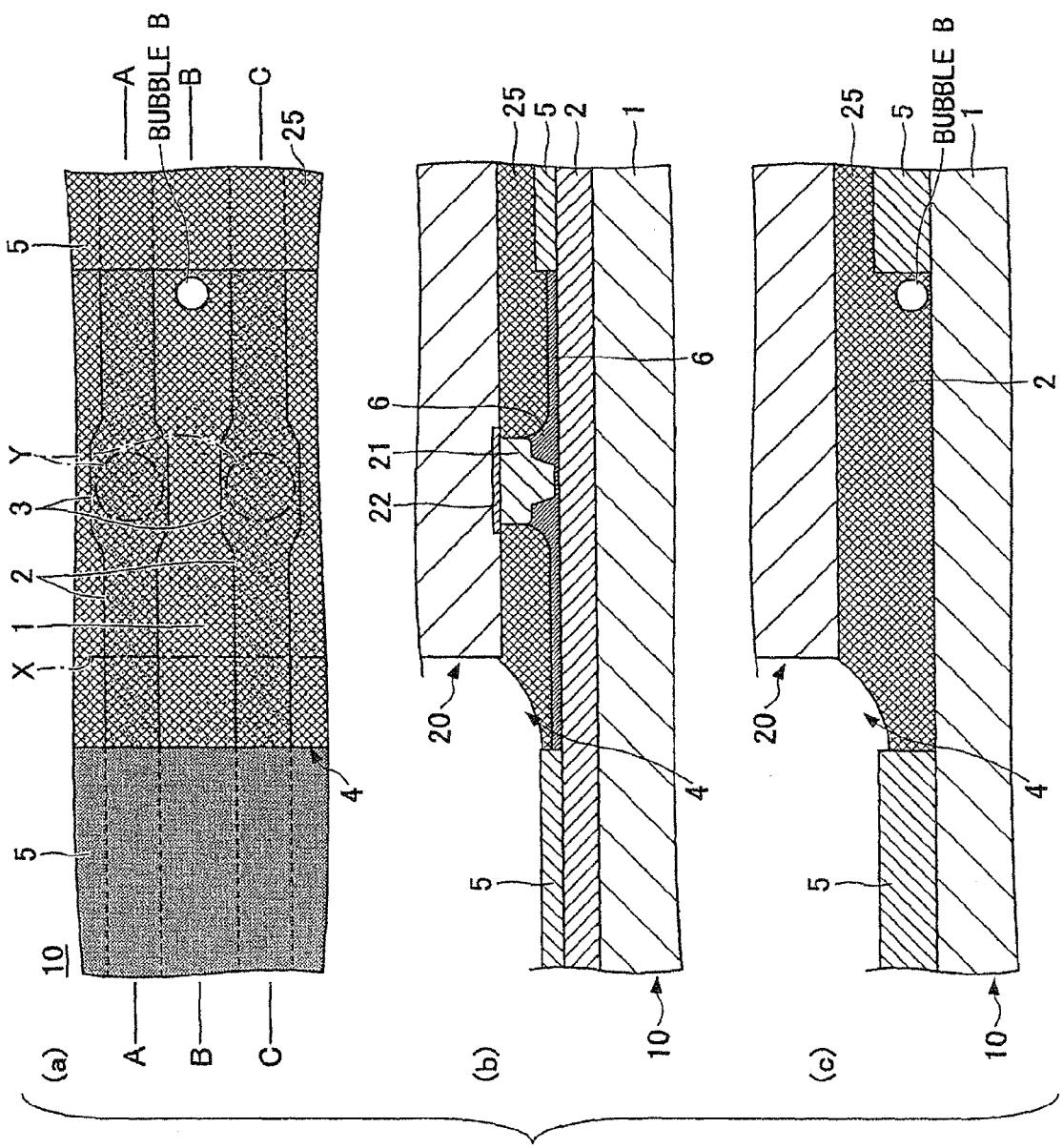
FIG. 5 is an illustrative drawing (case 4) showing a flip-chip mounting process for mounting a semiconductor element onto the wiring board 10 of FIG. 1.

In contrast, for the present example, the void B shown in FIG. 4 is hardly formed at the part indicated by β in FIG. 13, since the flow of the underfill material 42 continues on the substrate material 33 (indicated by β in FIG. 13) of the wiring board 31, and in parallel, the underfill material 42 flowing on the wiring pattern 34c flows onto the wiring pattern 33 (the part indicated by β in FIG. 13) of the wiring board 31 more than that flowing on the wiring pattern 34a.

Further, even if such void B is formed, the void B is transferred toward the wiring pattern 34a as the underfill material 42 flowing on the wiring pattern 34c flows onto the substrate material 33 (the part indicated by β in FIG. 13) of the wiring board 31.

As described above, as the underfill material 42 flowing on the wiring pattern 34a flows a little onto the substrate material 33 of the wiring board 31, the void moved to a side of the wiring pattern 34a is eliminated at the side of the wiring pattern 34a.

Further, as the wiring pattern 34 exposed in the opening part 38 is formed linearly in its extent direction, the underfill material 42 can flow along the wiring pattern 34 formed linearly, and even if a void B is generated within the underfill material 42, the void can be easily moved out while flowing.

The arranged direction of the bonding electrodes 36 is almost perpendicular to the extent direction of the wiring patterns 34. Then the extent direction of the wiring patterns 34 exposed in the openings 38 corresponds to a direction to the peripheral side of the semiconductor element 32, and the void can be easily moved out even if a void B is generated within the underfill material 42.

Further, in the present example, the peripheral part of the openings 38 on the wiring board 31 is formed outside of the peripheral region X on which the semiconductor element 32 is mounted face down (in a face-down manner).

Further, time having passed, as shown in FIG. 14, the underfill material 42 flows out all over the place, spreading to the peripheral part of the semiconductor element 32 and the sides of the semiconductor element 32, forming a fillet F, and consequently to be solidified by heat of the sticking tool 51.

Thus, the semiconductor 32 is mounted and connected to the one main plane surface of the wiring board 31 with the underfill material 42 using the flip-chip method. At least the projection parts of the projection external connecting terminals 35 of the semiconductor element 32 are connected to corresponding bonding electrodes 36 (see FIG. 7) on the wiring board 31, and both are commonly covered with the conducting material 41. Successively, as shown in FIG. 10(c), the semiconductor element 32 is detached from the sticking tool 51, and the sticking tool 5 is raised.

Further, in the process shown in FIG. 9(b), when the underfill material 42 is not solidified or incompletely solidified, a process may be added to completely solidify the underfill material 42 after the process shown in FIG. 10(c) by using an oven with heating at about 120° C. or 180° C. for about 30 minutes or 90 minutes.

After the process, to another main plane surface of the wiring board 31 on which plural semiconductor elements are mounted and fixed, the external connecting electrodes 55 using such as solder ball electrodes made of solder of tin (Sn)—silver (Ag), tin (Sn)—silver (Ag)—copper (Cu), or the like, are provided in form of plural grids. After that, the wiring board 31 is sliced by a dicing blade to separate it and make unit chips of the semiconductor elements 32 to be mounted. Thereby, as shown in FIG. 10(d), the semiconductor device is formed by which the semiconductor element 32 is mounted on the wiring board 31 using the flip-chip mounting technique.

Further, if necessary, for the semiconductor element 32, before making unit chips, for example, a resin sealing treatment may be used for the plane surface of the wiring board 31, on which the semiconductor element 32 of the wiring board 31 is mounted. After the resin sealing treatment, as a unit on which the semiconductor element 32 is mounted, the wiring board 31 and the resin part for sealing are cut in the thickness direction, and a semiconductor device sealed with resin and diced as a unit chip is formed.

Further, in the example described above, for the solder resist layer 37, the openings 38 are formed along the faced short sides of the wiring board 31, the part at the outer side of the wiring board 31 in the peripheral part of the openings 38 is formed almost parallel to the arranged direction of the bonding electrodes 36 and the central side of the peripheral part of the openings 38 is formed to have a different direction from the arranged direction of the bonding electrodes 36. That is, the central side of the peripheral part of the openings 38 is formed in an oblique direction against the arranged direction of the bonding electrodes 36, having a zigzag shape with predetermined angles such as a saw teeth shape.

Figure 15:
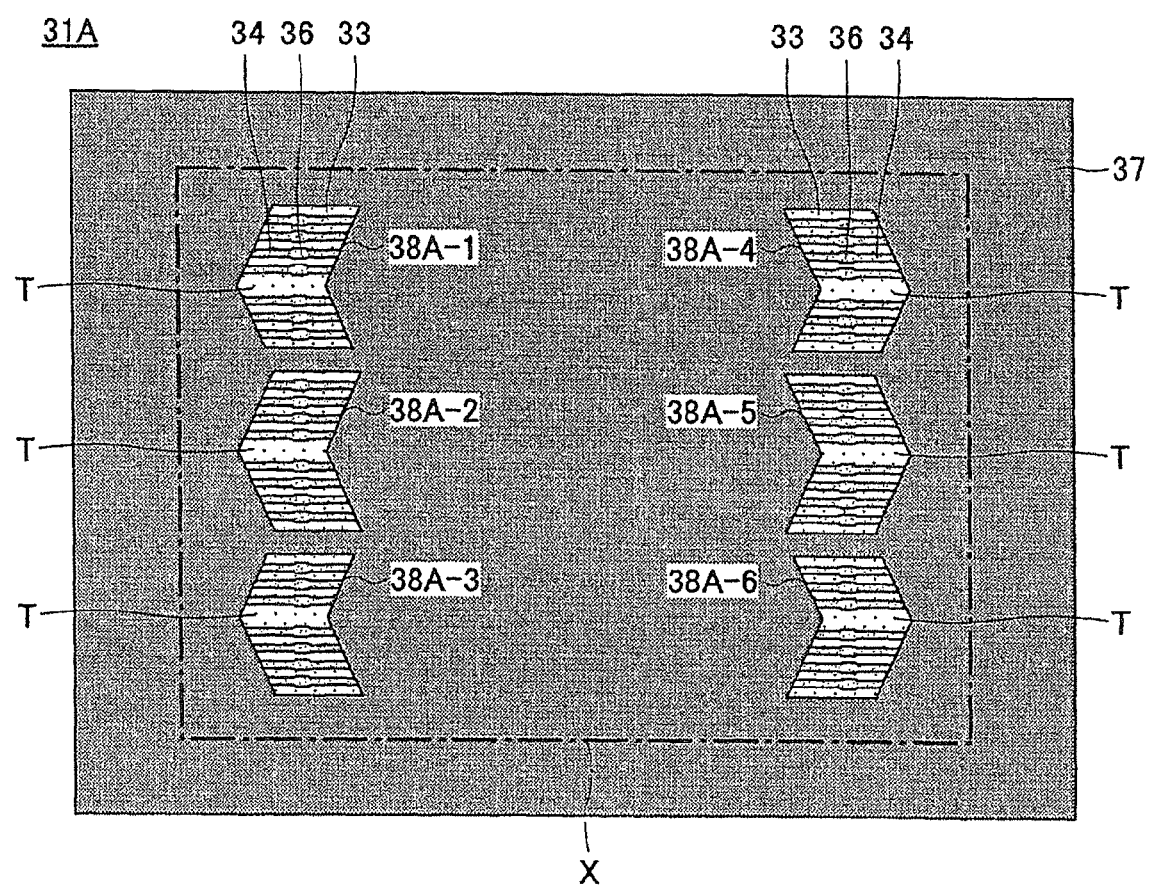
FIG. 15 is an illustrative drawing showing a plan view of a wiring board structure related to a variation (case 1) of the first embodiment of the present invention.

However, the present invention is not limited to the above example; the shape of the opening parts may be as shown in FIG. 15. Then, FIG. 15 is an illustrative drawing showing a plan view of a wiring board that is a variation (case 1) related to the first embodiment of the present invention. In FIG. 15, the numbers of identical parts shown in FIG. 7 are assigned with the same numbers, and the explanation is omitted. Further, in FIG. 15, the alternate long and dash line indicates the peripheral area where the semiconductor element is mounted face down (in a face-down manner) on the wiring board 31A.

For the wiring board 31A shown in FIG. 15, for the solder resist layer 37, opening parts 38A-1 through 38A-3 and opening parts 38A-4 through 38A-6 are provided along the facing short sides of the wiring board 31A.

For peripheral parts of each opening part 38A-1 through 38A-6, the part located near the central side of the wiring board 31A has different directions from the arranged direction of the bonding electrodes 36, that is, it is not parallel to the arranged direction of the bonding electrodes 36, having a zigzag shape with predetermined angles, and for a peripheral part of the opening parts 38A-1 through 38A-6, the part positioned to the outer side of the central side of the wiring board 31A has different directions from the arranged direction of the bonding electrodes 36, having the zigzag shape with not parallel direction to the arranged direction of the bonding electrodes 36, and almost parallel shape.

Therefore, for the peripheral parts of the opening parts 38A-1 through 38A-6, the parts located near the central part of the wiring board 31A are formed in different directions from the arranged direction of the bonding electrodes 36, that is, they are formed in oblique directions (not parallel) against the arranged direction of the bonding electrodes 36, and this can prevent generating a void B.

Even if a void B is generated, as described above, at the peripheral parts of the opening parts 38A-1 through 38A-6 of the wiring board 31A, parts located to the outer side on the wiring board 31A include zigzag shapes with predetermined angles, and this arrangement can remove the voids B out of the opening parts 38A-1 through 38A-6 of the parts having the determined angles.

Further, for each opening part of 38A-1 through 38A-6, adjacent plural wiring patterns 34 are commonly exposed, and the exposed area of individual wiring patterns 34 is the same. Thus when a conducting material 41 is formed on each wiring pattern 34, their formed amount can be made uniform.

Figure 16:
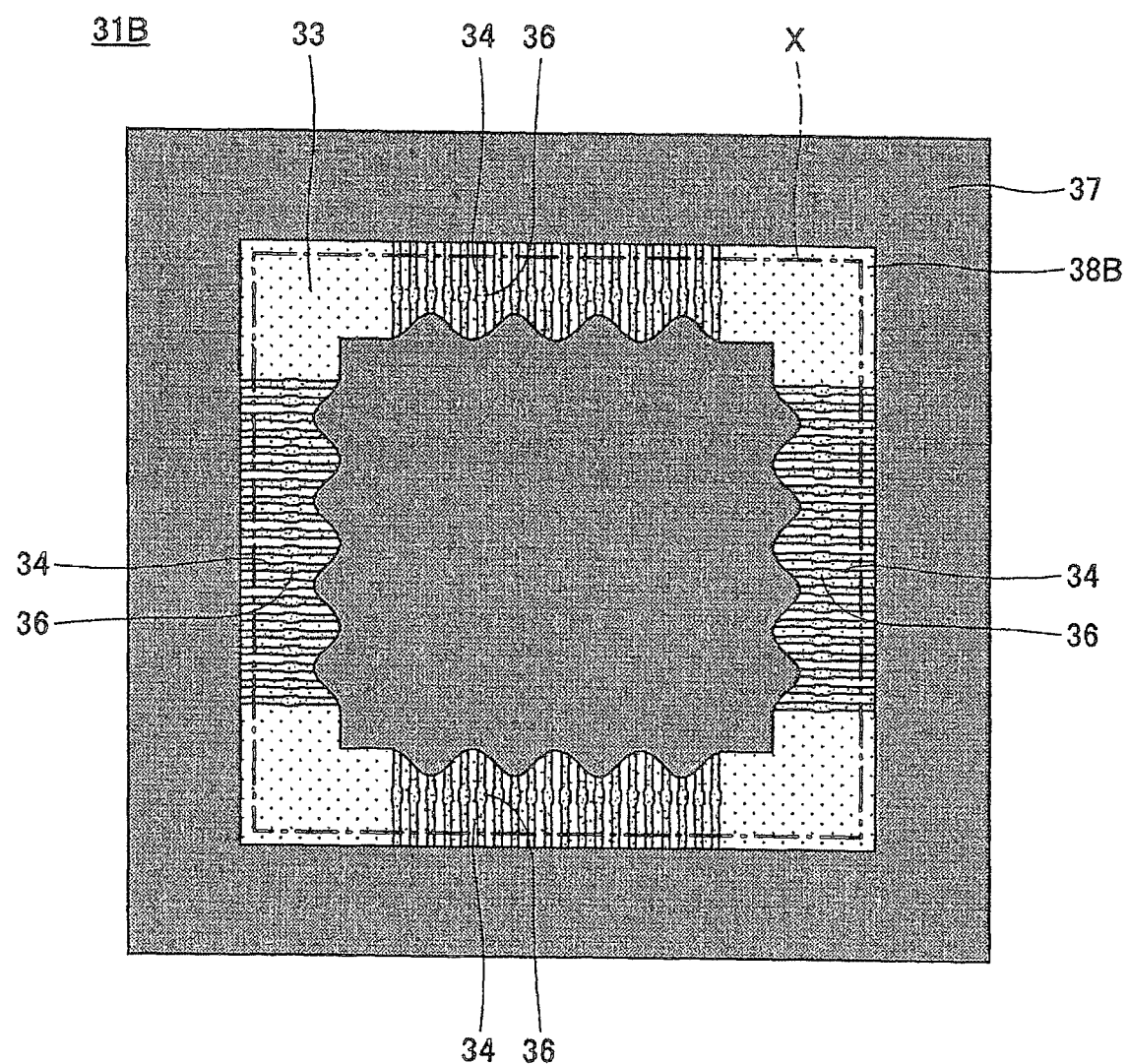
FIG. 16 is an illustrative drawing showing a plan view of a wiring board structure related to a variation (case 2) of the first embodiment of the present invention.

Further, the shape of the opening part may be a shape shown in FIG. 16. FIG. 16 shows a plan view of a wiring board structure related to the variation (case 2) of the first embodiment of the present invention. Further in FIG. 16, the identical parts used in FIG. 7 are assigned the identical numbers, and the explanations are omitted. For FIG. 16, the alternate long and short dash line X indicates the peripheral area of a semiconductor element that is mounted face down (in a face-down manner) on the wiring board 31B.

The wiring board 31B shown in FIG. 16 is a substrate on which a semiconductor element, having projection external connecting terminals formed along the four sides on the main plane surface of the semiconductor element, is flip-chip mounted. The opening part 38B is formed in the solder resist layer 37 with a ring-shape, and a row of the bonding electrodes 36, on which the projection external connecting terminals are mounted, is exposed along each of four sides of the wiring board 31B.

The peripheral part of the opening part 38B is formed to be almost in parallel to the arranged direction of the bonding electrodes 36, while the inner part of the opening part 38B is formed to be curve shaped (undulating line in the present example).

Thus, the internal peripheral edge of the opening part 38B is in a different direction than the arranged direction of the bonding electrodes 36, that is, it is formed in an oblique direction (not parallel) against the arranged direction of the bonding electrodes 36, so that generating voids B can be prevented as in the same manner shown in FIG. 7.

Figure 17:
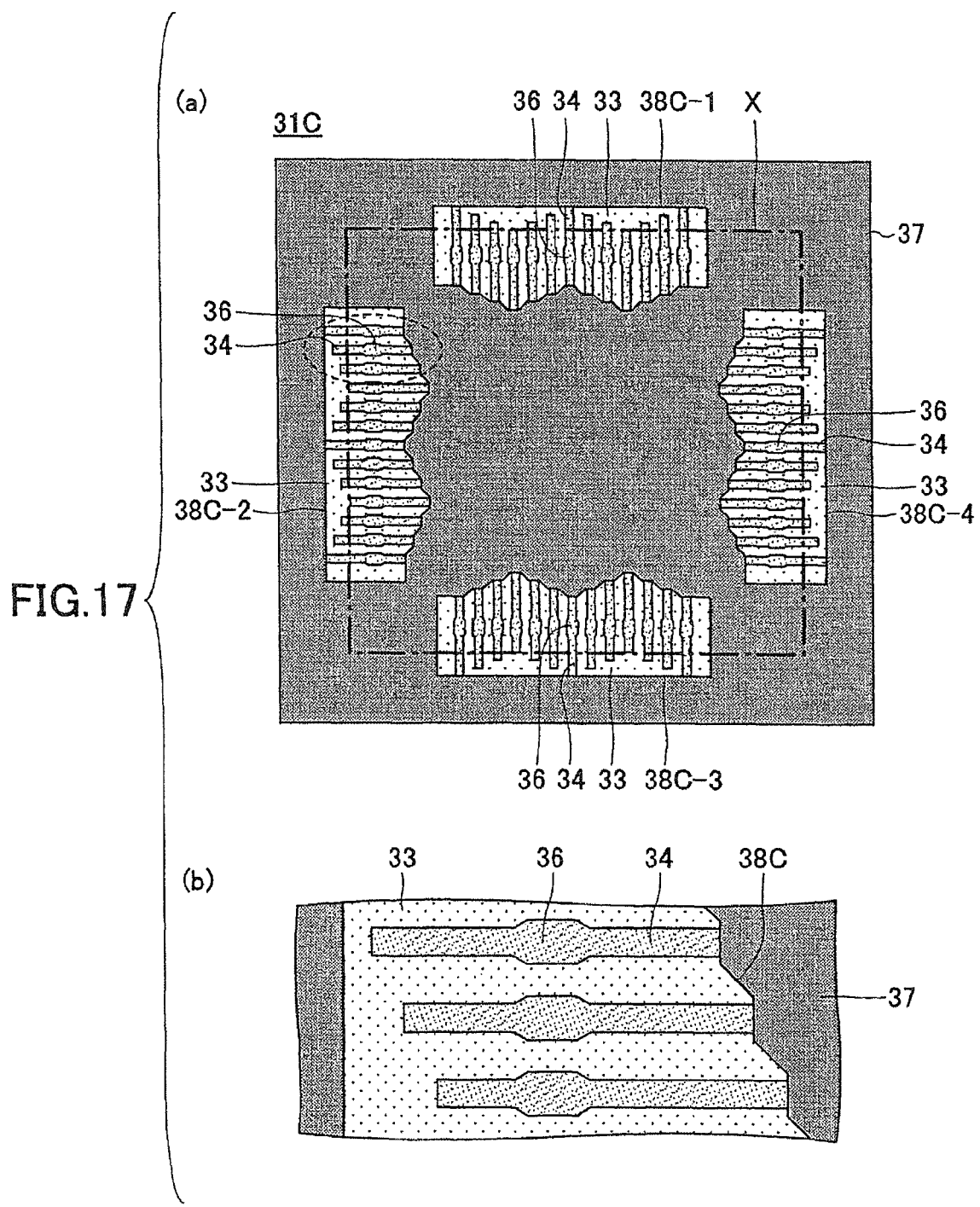
FIG. 17 is an illustrative drawing showing a plan view of a wiring board structure related to a variation (case 3) of the first embodiment of the present invention.

Further, the shape of an opening part may be that shape shown in FIG. 17. FIG. 17 shows a plan view of a wiring board related to the variation (case 3) in the first embodiment of the present invention.

Further, in FIG. 17, the identical numbers are used for the identical parts shown in FIG. 7, and the explanation is omitted. An alternate long and short dash line X indicated in FIG. 17 shows the peripheral area on which a semiconductor element is mounted face down (in a face-down manner) on the wiring board 31C.

The wiring board 31C shown in FIG. 17 is a flip-chip mounting substrate on which a semiconductor element with projection external connecting terminals formed along the four sides on it is mounted, wherein the four openings 38C-1 through 38C-4 are provided along the four sides of the wiring board 31C.

For the peripheral part of each opening 38C-1 through 38C-4, the outer side part of the wiring board 31C is formed to be almost parallel to the arranged direction of the bonding electrodes 36. On the other hand, for the peripheral part of each opening 38C-1 through 38C-4, the inner side part of the wiring board 31 is formed to be step shaped. For the individual opening parts 38C-1 through 38C-4, the partial wiring patterns 34 are commonly exposed.

Openings 38C-1 through 38C-4 are described in detail regarding the shape at the central side part of the wiring board 31, i.e., the step shape, by referring to FIG. 17(b).

In the present example, for the peripheral parts of opening 38C-1 through 38C-4, a central side part on the wiring pattern 34 on the wiring board 31 is formed to be almost parallel to the arranged direction of the bonding electrodes 36. It can distinguish the timing of flows onto the adjacent wiring patterns 34 in the opening 38C.

Figure 18:
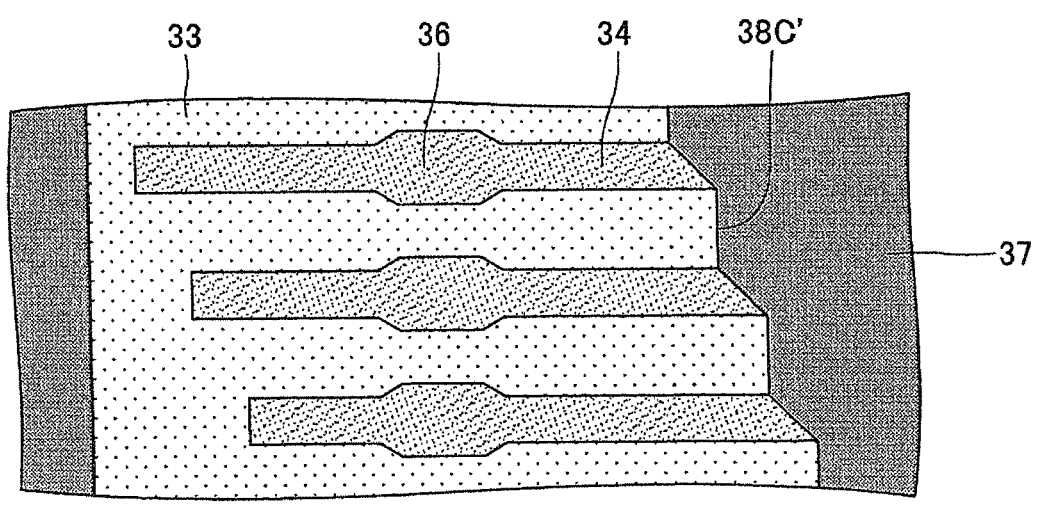
FIG. 18 is a partially enlarged illustrative drawing of the variation of the wiring board in FIG. 17.

Further, for the peripheral parts of opening 38C-1 through 38C-4, located the central side of the wiring board 31, the shape of a part located on the wiring pattern 34 may be a different shape from that of FIG. 17(b) as shown in FIG. 18.

Therefore, in the example shown in FIG. 8, peripheral part of the opening 38C', located on the inner side of the wiring board 31 and on the wiring pattern 34, the part is formed in an oblique direction (not parallel) against the arranged direction of the wiring patterns 34. The parts that are located between the adjacent wiring patterns 34 on the substrate material 33 are formed to be almost parallel to the arranged direction of the bonding electrodes 36. With these shapes, the flow-in timing of the underfill material 42, which flows onto the adjacent wiring patterns 34 in the opening part 38C', can be differentiated.

Thus, for the peripheral parts of opening 38C-1 through 38C-4, as the part located at the inner side of the wiring board 31 is formed in an oblique direction (not parallel) against the arranged direction of the wiring patterns 34, generating voids B can be prevented in the same manner as shown in FIG. 7.

Further, as for parts of openings 38C-1 through 38C-4, commonly partially exposed areas of adjacent wiring patterns 34 are the same. Thus, when the conducting material 41 is formed on the wiring patterns 34, the forming amount can be constant.

In short, for the peripheral region of the openings 38, the part located on the central side of the wiring board 31 (the edge is toward to a central part of the wiring board) is formed in a different direction compared to the arranged direction of the wiring patterns 34, that is, as long as it is not parallel to the arranged direction of the wiring patterns 34, the shape is not limited. For example, the part can be a zigzag shape as shown in FIG. 7, or a step shape as shown in FIG. 17 and FIG. 18. In either case, generating a void B in the underfill material 42 can be prevented.

As described above, in the first embodiment of the present invention, the underfill material 42 is preliminarily provided on the wiring board 31 when the semiconductor element 32 is mounted on the wiring board 31. In terms of having the semiconductor element 32 mounted on the wiring board 31 with the underfill material 42, the underfill material 42 is spread and flows all over the region of the semiconductor element due to the capillary effect. At the same time, by the heat provided when the semiconductor element 32 is mounted on the wiring board 31, the underfill material 42 is solidified. The wiring board 31 using the above method has been explained.

However, the present invention is not limited to such an example, and it is applicable for the following case as well; after a semiconductor element is mounted on and connected to a wiring board, an underfill material is coated near the peripheral region of the semiconductor element on the wiring board and flows all over the area of the semiconductor element, and the underfill material is solidified by succeeding heating. Thus it is applicable a wiring board using such a method. This is explained as a second embodiment of the present invention in the following.

Figure 19:
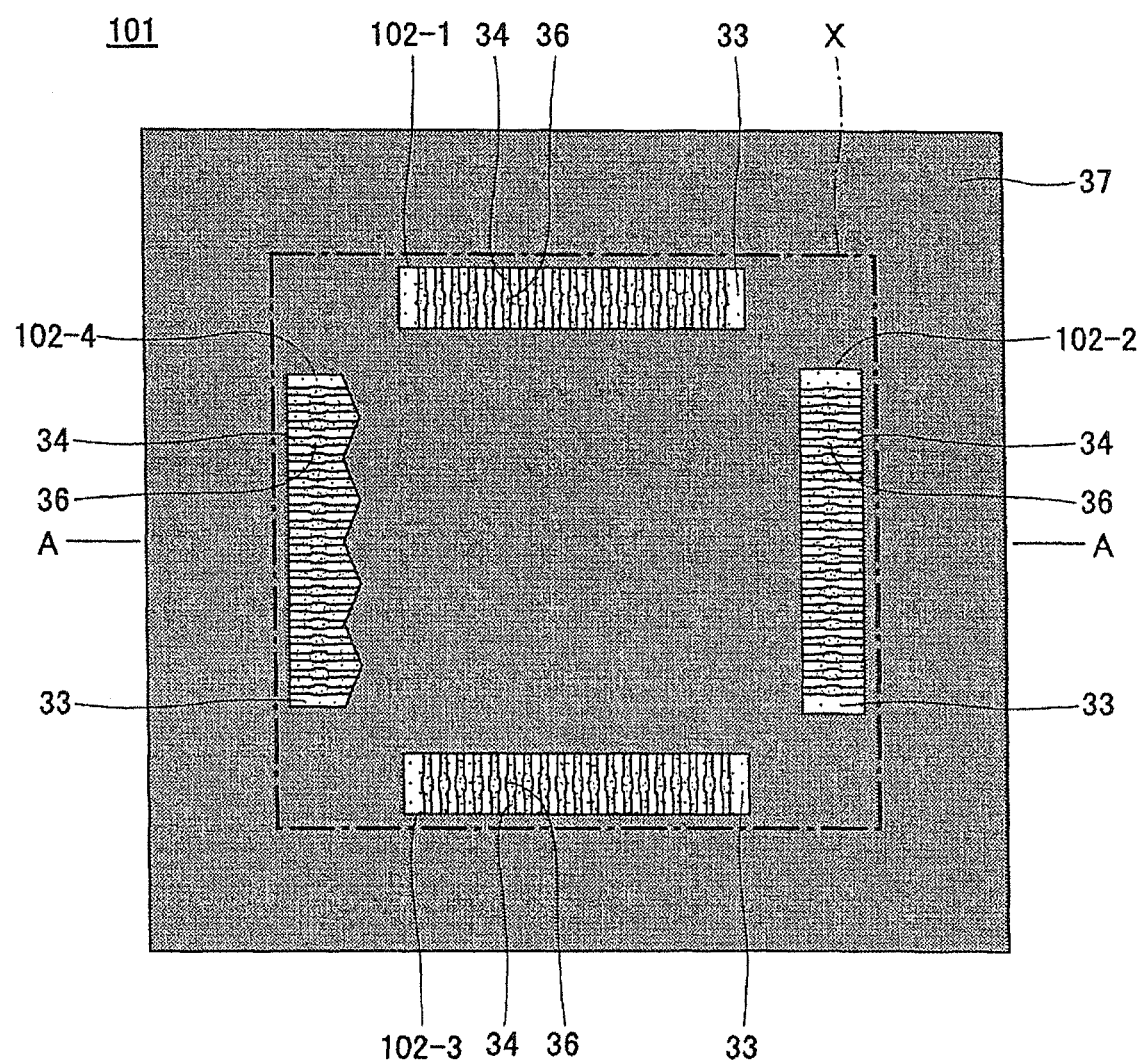
FIG. 19 is an illustrative drawing related to a second embodiment of the present invention and showing a plan view of the wiring board structure.

FIG. 19 shows a plan view of the wiring board related to the second embodiment of the present invention. In FIG. 19, the identical parts referred in FIG. 7 are assigned the identical numbers, and the explanations are omitted. Further, for FIG. 19, the alternate long and short dash line X indicates the peripheral region of the wiring board 10 on which a semiconductor element is mounted face down (in a face-down manner).

Referring to FIG. 19, a solder resist layer 37 is formed on a wiring board 101, plural bonding electrodes 36 are provided in rows, and opening parts 102-1 through 102-4 are formed continuously along the arranged directions of the plural bonding electrodes 36, so that the individual opening parts are formed along the four sides of the wiring board 101.

In the first embodiment described above, the peripheral parts of the opening parts 38 are formed outside the area in which the semiconductor element 32 is mounted, which is the outer side of the wiring board 31.

For each opening part 102-1 through 102-3, on the central side and the outer side of the wiring board 101, the longitudinal peripheral parts of them are formed to be parallel to the arranged direction of the bonding electrodes 36.

On the other hand, in FIG. 19, the opening part 102-4, provided on the left side of the wiring board 101, includes a similar shape to the opening part 38 in FIG. 7. Thus, for the peripheral part of the opening part 102-4, the part locating at the outer side on the wiring board 101 is formed to be almost parallel to the arranged direction of the bonding electrodes 36. For the peripheral part of the opening 102-4, the part locating at the inner part on the wiring board 31 is formed in different directions relative to the arranged direction of the bonding electrodes 36; that is, it is formed in an oblique direction against the arranged direction of the bonding electrodes 36 and includes a zigzag shape with predetermined angles, like saw teeth.

For each opening part 102-1 through 102-3, and 102-4, the adjacent wiring patterns are commonly partially exposed.

Figure 20:
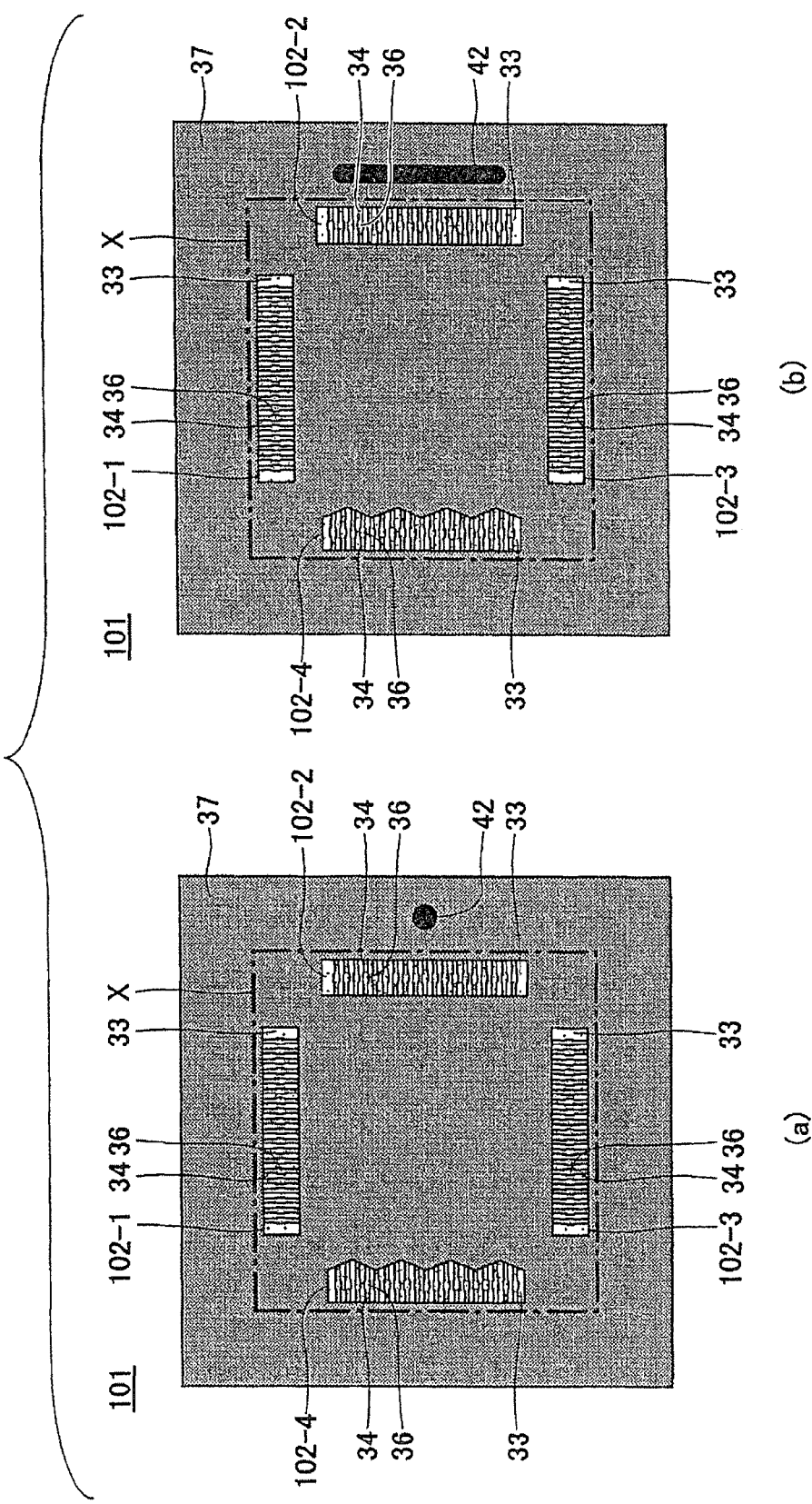
FIG. 20 is an illustrative drawing showing an application of underfill resist to the wiring board indicated in FIG. 19.

When a semiconductor element is mounted on and connected to such a structured wiring board 101, in dark parts as indicated in FIG. 20, an underfill material 42 is coated near the peripheral part of the semiconductor element on the wiring board 101.

Further, in the example shown in FIG. 20(a), at the peripheral side of the opening part 102-2, the underfill material 42 is applied to the one part, and another example shown in FIG. 20(b) shows that the underfill material 42 is applied on the peripheral side of the opening 102-2 by way of drawing lines.

The underfill material 42 applied on the wiring board 101 starts flowing and flows onto the individual opening parts 102-1 through 102-3, and the opening part 102-4. At the period, the opening part 102-1 through 102-3 near the part where the underfill material 42 is applied, the flowing velocity of the underfill material 42 is relatively high, so that voids are not easily generated in the underfill material 42. On the other hand, for the bonding electrodes 36 on the wiring board 101, located in the part which is most distant from the part where the underfill material 42 is provided, the underfill material 42 flows in with a low flowing velocity, so that the fluidity of it is low, and voids are likely to be generated in the underfill material 42.

However, in the present example, for the shape of the peripheral part of the opening 102-4, the part of the central side on the wiring board 101 is in different directions relative to the arranged direction of the bonding electrodes 36, i.e., as it is not parallel to the arranged direction of the bonding electrodes 36, generating voids in the underfill material 42 can be prevented in the same manner as described in the first embodiment of the present invention.

Further, the opening shape of the opening part 102-4 is not limited to the present case; for the peripheral part (edge) of the opening part 102-4, the part (edge) located on the central side of the wiring board 101 has a different direction from the arranged direction of the bonding electrodes 36, i.e., as long as the part is formed in an oblique direction against the arranged direction of the bonding electrodes 36, even if its shape is a wavy shape as shown in FIG. 16 or a step shape as shown in FIG.17 and FIG. 18.

Figure 21:
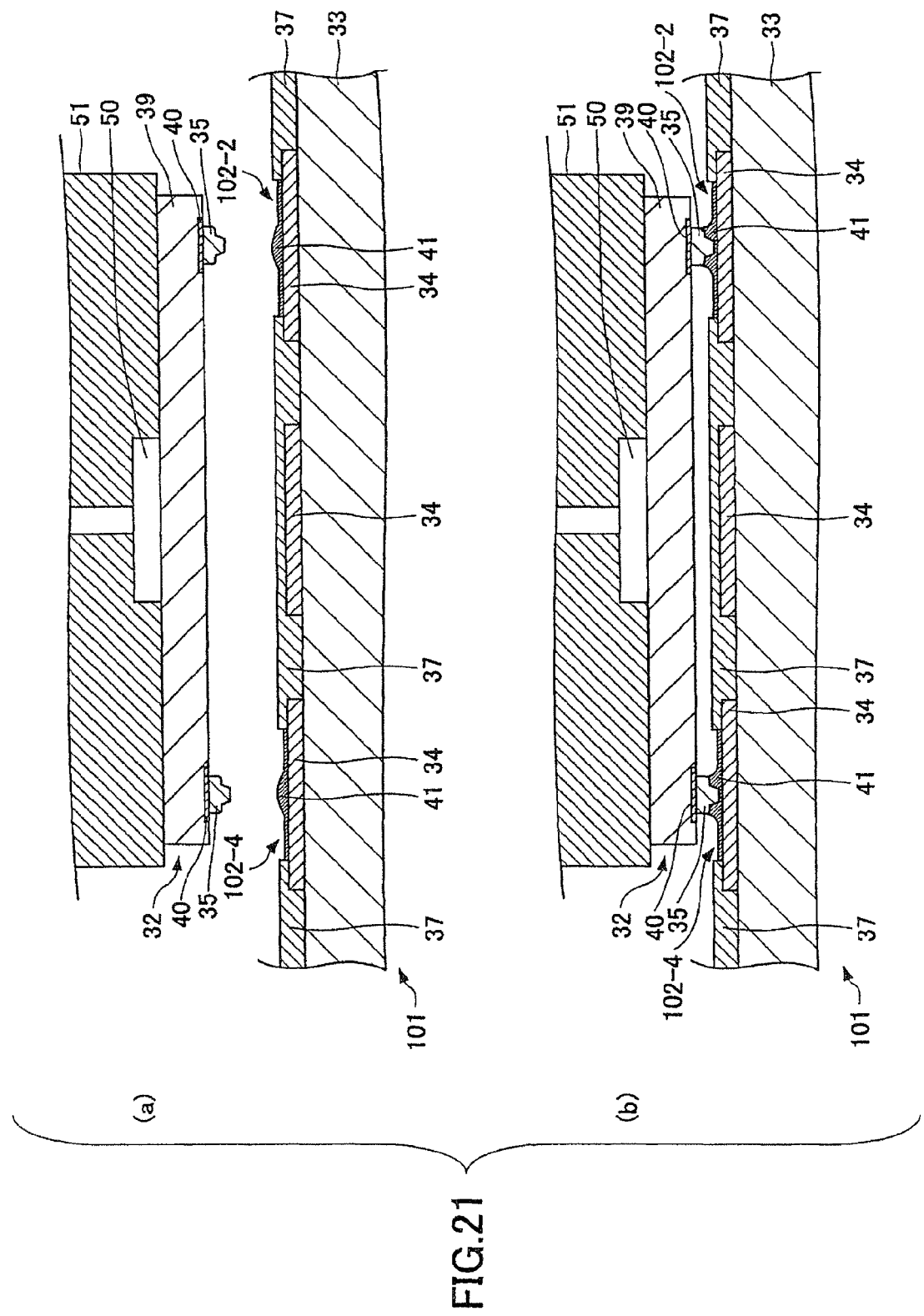
FIG. 21 is an illustrative drawing (case 1) showing a flip-chip mounting process of a semiconductor onto the wiring board of FIG. 19.
Figure 22:
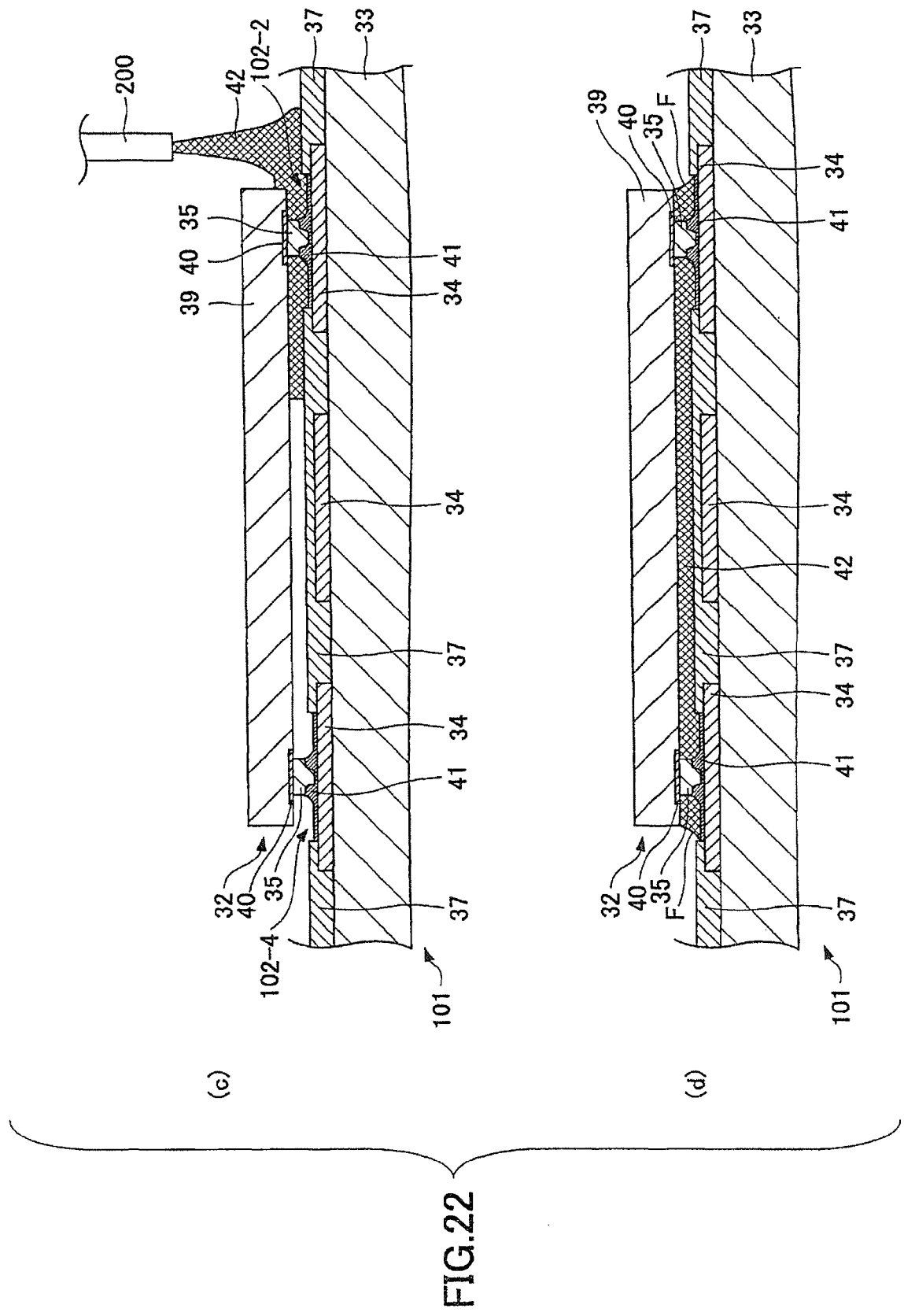
FIG. 22 is an illustrative drawing (case 2) showing a flip-chip mounting process of a semiconductor onto the wiring board of FIG. 19.

Further, the following explains the flip-chip mounting processes of the semiconductor element 32 onto the wiring board 101 with the structure described above. FIG. 21 and FIG. 22 are illustrative drawings (step 1) and (step 2) for explaining the flip-chip mounting process to mount the semiconductor element 32 onto the wiring board 101 indicated in FIG. 19. Then, in FIG. 21 and FIG. 22, it shows the cross-sectional view at the line A-A of the wiring board 101 in FIG. 19, and the semiconductor element 32 is mounted on such a wiring board 101 by flip-chip mounting.

First, as shown in FIG. 21(a), the wiring board 101 is placed and held on a bonding stage (not shown).

At this time, the wiring board 101 may be heated by heating the bonding stage above at a temperature of about 50° C. through about 100° C.

Further, the wiring patterns 34 of the bonding electrodes 36 (see FIG. 19) on the wiring board 101 are preliminarily provided with a conducting material 41 by using the printing method, the transferring method, the evaporation method, or the chemical reaction deposition method.

A main plane surface of the semiconductor element 32 is made parallel to a main plane surface of the wiring board 101, the plane surface of the semiconductor element 32 having the projection external connecting terminals 35 is faced down, a sticking tool 51 having a suction hole 50 holds the semiconductor element, the projection external connecting terminals 35 face the bonding electrodes 35 of the semiconductor element 34 (see FIG. 19), and alignment is performed.

On the other hand, the sticking tool 51 is lowered, the part of the projection external connecting terminal 35 of the semiconductor element 32 contacts the conducting material 41 provided on the bonding electrodes 36 (see FIG. 19), the sticking tool 51 applies a force, so that the conducting material 41 is melted. As a result, the conducting material 41, at least, covers the projection part of the projection external connecting terminals 35 with the conducting material 41, and the projection external connecting terminals 35 of the semiconductor element 32 are connected to the bonding electrodes 36 (see FIG. 19) of the wiring board 101. This condition is shown in FIG. 21(b).

In the present process, the force applied by the sticking tool 51 is dependent upon the material characteristics or the structure of the projection external connecting terminals 35 of the semiconductor element 32 and the bonding electrodes 36 (see FIG. 7) of the wiring board 101, the flip-chip mounting method itself, or the like. For example, a force may be applied to be about 1 gf or about 140 gf to one terminal of the projection external connecting terminals 35. Further, in the present process, in addition to a force and heating, a method of applying ultrasonic waves or a method of applying a force and ultrasonic waves without heating may be used.

Followed by removing sticking of the semiconductor element 32, raising the sticking tool 51, lowering the temperature of the conducting material 41 to room temperature, the mounting process of the semiconductor element 32 onto the wiring board 31 is completed.

After that, as shown in FIG. 22(c), a part near one edge of the semiconductor element 32 on the wiring board 101, more specifically, at the outside of an opening 102-2 shown in FIG. 19 (see FIG. 20(a)), as one point or a line (see FIG. 20(b)), the underfill material 42 with a paste form is applied through a nozzle 200 of a dispenser (not shown).

Further, before being applied, the underfill material 42 may be preliminary heated, for example, to about 50° C. through about 100° C. When the underfill material 42 is applied, the wiring board 101 and the semiconductor element 32 may be heated, for example, to about 50° C. through about 100° C. By the heating, the viscosity of the underfill material 42 becomes lower, and the fluidity of the underfill material 42 is enhanced for its flowing.

The underfill material 42 applied flows in the gap between the wiring board 101 and the semiconductor element 32 by the capillary effect, and continues flowing onto each of the opening parts 102-1 through 102-3, and the opening part 102-4. In the period, for the opening parts 102-1 through 102-3 near the part where the underfill material 42 is applied, the flowing velocity of the underfill material 42 is relatively high, so that voids are not easily generated in the underfill material 42. Further, in the present example, for the shape of the peripheral part of the opening 102-4, the part of the central side on the wiring board 101 is in a different direction relative to the arranged direction of the bonding electrodes 36, i.e., as it is not parallel to the arranged direction of the bonding electrodes 36, generating voids in the underfill material 42 can be prevented in the same manner as described in the first embodiment of the present invention.

After time has passed, the underfill material 42 flows all over the place, spreading to the peripheral part of the semiconductor element 32, the sides of the semiconductor element 32 and the surface of the wiring board 101, and a fillet F is formed.

Further, by using an oven with heating at about 120° C. to 180° C. for about 30 minutes to 90 minutes, the underfill material 42 is completely solidified.

Thereby, a structure where the semiconductor element 32 is mounted and solidified on one side of the main plane surface of the wiring board 101 using the flip-chip (face down) method is formed.

Figure 23:
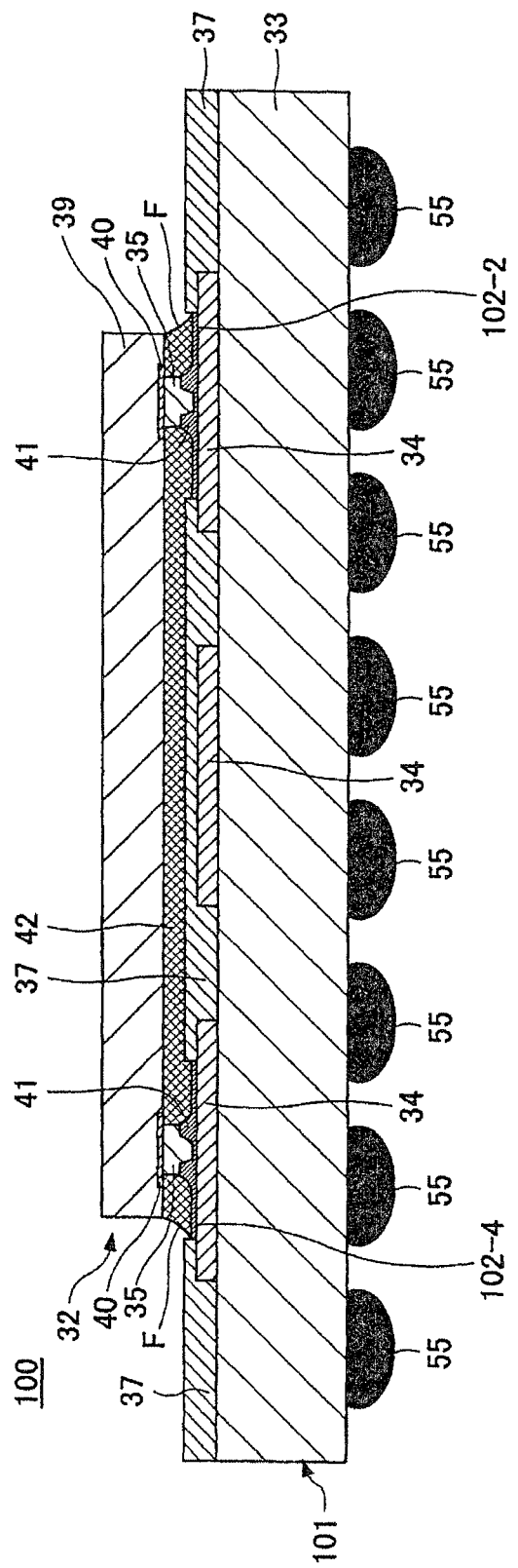
FIG. 23 is an illustrative drawing showing a semiconductor device with a semiconductor element that has been flip-chip mounted on the wiring board.

After the process, to another main plane surface of the wiring board 101 on which plural semiconductor elements 32 are mounted and fixed, the external connecting electrodes 55 using such as solder ball electrodes made of solder of tin (Sn)—silver (Ag), tin (Sn)—silver (Ag)—copper (Cu), or the like, are provided in the form of plural grids. After that, the wiring board 31 is sliced by a dicing blade to separate it and make a unit chip of the semiconductor element 32 to be mounted. Thereby, as shown in FIG. 23, the semiconductor device is formed by which the semiconductor element 32 is mounted on the wiring board 100 using the flip-chip mounting technique.

Further, if necessary, for the semiconductor element 32, before making unit chips, for example, a resin sealing treatment may be used for the plane surface of the wiring board 101, on which the semiconductor element 32 of the wiring board 101 is mounted. After the resin sealing treatment, as a unit place on which the semiconductor element 32 is mounted, the wiring board 101 and the resin part for sealing are cut in the thickness direction, and a semiconductor device sealed with resin and diced as a unit chip is formed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

For example, in the first embodiment of the present invention described above, as shown in FIG. 11 and the other Figures, the edge of the resist layer 37 to define the opening part 38 is formed to be perpendicular to the wiring board 31. Although the opening area of the opening part 38 on the resist layer 37 is uniformly formed and even in thickness direction, the present invention is not limited, and it may have a different structure as shown in FIG. 24.

Figure 24:
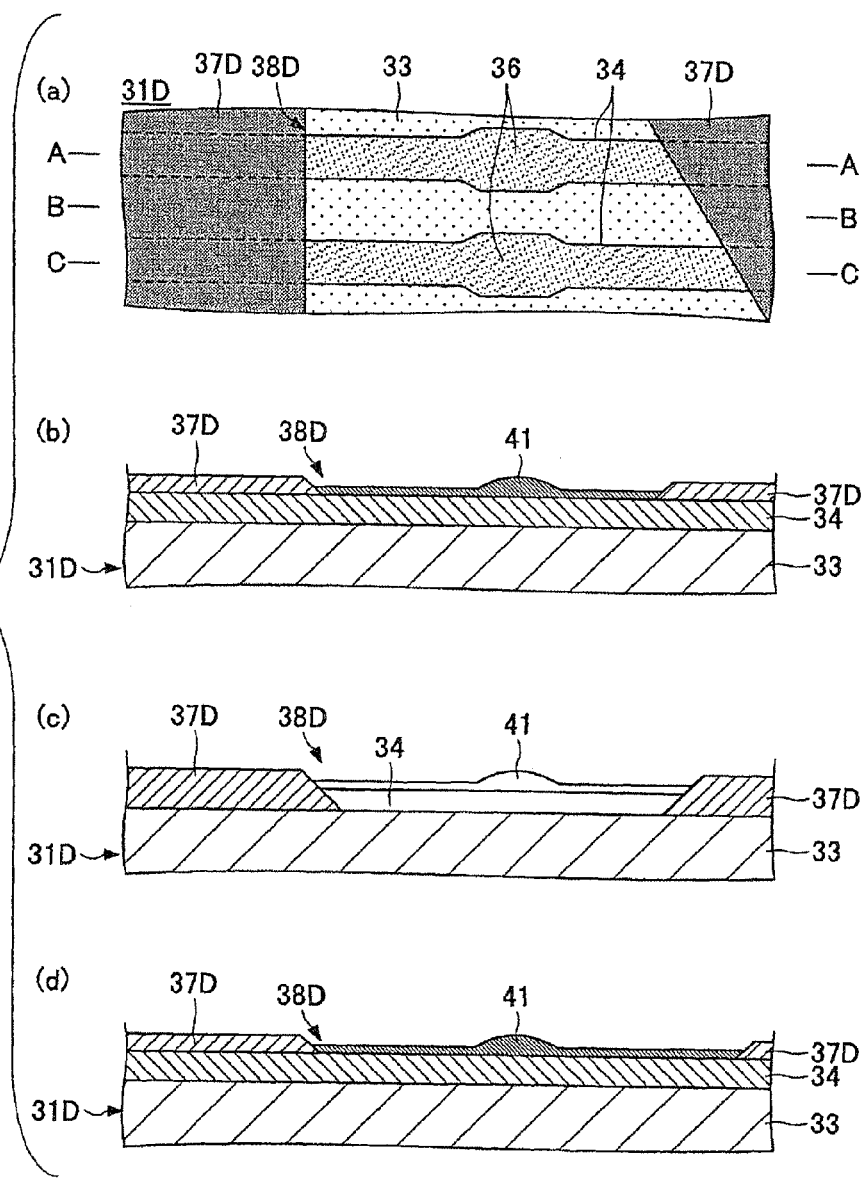
FIG. 24 is an illustrative drawing showing a variation of an edge shape of a resist layer that defines the outer area of opening.

FIG. 24 is to explain another shape of the edge of the resist layer 37 defining the peripheral part of the opening part 38, where (a) shows an enlarged view of the part indicated by a broken line in FIG. 7; (b) is a cross-sectional view at line A-A of (a); (c) shows a cross-sectional view of (a) at line B-B, and (d) shows the cross section at the line C-C of (a).

Referring to FIG. 24, in the present example, the edge part of the resist layer 37D defines the peripheral part of the opening part 38D. The cross-sectional shape is formed to be an inverted taper, and the opening area of the opening part 38D in the resist layer 37 is formed to become larger in the thickness direction for upward.

With an effect of the outer shape of the opening 38D, by such a structure, the underfill material 42 can flow into the opening part 38D of the resist layer 37D, and generating voids in the underfill material 42 can be prevented at a part near the opening edge (end edge) of the solder resist layer 37D located at the central side of the wiring board 38.

In particular, it is preferable for the angle at the edge of the resist layer 37D with the inversed taper cross section to be smaller. If the angle become smaller, the underfill material 42 can surly fill the space between the substrate material 33 of the wiring board 31 and the edge of the resist layer 37D, and generating and involving voids at that part can be prevented.

Further, of course, the structure shown in FIG. 24 can be applied to the second embodiment of the present invention.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

What is claimed is:

1. A wiring board, comprising:
   a mounting surface where an electronic component is to be mounted, the electronic component having a plurality of external connecting terminals on a surface thereof;
   an insulating layer formed on the mounting surface; and
   a plurality of opening parts each formed in the insulating layer between a center and a periphery of the wiring board so that a plurality of wiring patterns are commonly and partially exposed, the wiring patterns having electrodes where the external connecting terminals of the electronic component are to be connected,
   wherein each of the opening parts is defined by first and second opposed edges of the insulating layer,
   at least one of the opening parts has the first edge thereof formed in an oblique direction against extending directions of the wiring patterns, and
   respective exposed areas of the wiring patterns exposed in the at least one of the opening parts are almost equal to each other with the wiring patterns having respective ends toward the periphery of the wiring board positioned on a line oblique to the extending directions of the wiring patterns in the at least one of the opening parts.

2. The wiring board according to claim 1,
   wherein the first edge of the at least one of the opening parts includes a step shape.

3. The wiring board according to claim 1,
   wherein the plural wiring patterns exposed in the opening parts are formed almost linearly in the extending directions.

4. The wiring board according to claim 3,
   wherein the electrodes are arranged in a direction perpendicular to the extending directions of the wiring patterns.

5. The wiring board according to claim 1,
   wherein the electrodes are wider than other parts of the wiring patterns.

6. The wiring board according to claim 1,
   wherein a conducting material is provided on the plural wiring patterns; and
   the external connecting terminals of the electronic component are to be connected to the corresponding wiring patterns of the wiring board with the conducting material.

7. The wiring board according to claim 1,
   wherein the second edges of the opening parts are formed outside of a peripheral region of the electronic component.

8. The wiring board according to claim 1,
   wherein the at least one of the opening parts is formed along a side of the wiring board most distant from an adhesive inflow side of the wiring board.

9. The wiring board according to claim 1,
wherein an edge of the insulating layer to define a periphery of the opening parts is formed to have a cross-sectional shape of an inverted taper.

10. A mounting structure of an electronic component comprising:
a mounting surface of a wiring board where an electronic component is mounted, the electronic component having a plurality of external connecting terminals on a surface thereof;
an insulating layer formed on the mounting surface; and
a plurality of opening parts each formed in the insulating layer between a center and a periphery of the wiring board so that a plurality of wiring patterns are commonly and partially exposed, the wiring patterns having electrodes where the external connecting terminals of the electronic component are connected,
wherein each of the opening parts is defined by first and second opposed edges of the insulating layer,
at least one of the opening parts has the first edge thereof formed in an oblique direction against extending directions of the wiring patterns, and
respective exposed areas of the wiring patterns exposed in the at least one of the opening parts are almost equal to each other with the wiring patterns having respective ends toward the periphery of the wiring board positioned on a line oblique to the extending directions of the wiring patterns in the at least one of the opening parts.

11. The mounting structure of an electronic component according to claim 10,
wherein a conducting material is provided on the plural wiring patterns; and
the external connecting terminals of the electronic component are connected to the corresponding wiring patterns of the wiring board with the conducting material.

12. The mounting structure of an electronic component according to claim 10,
wherein the second edges of the opening parts are formed outside of a peripheral region of the electronic component.

13. The mounting structure of an electronic component according to claim 10,
wherein the at least one of the opening parts is formed along a side of the wiring board most distant from an adhesive inflow side of the wiring board.

14. The mounting structure of an electronic component according to claim 10,
wherein an edge of the insulating layer to define a periphery of the opening parts is formed to have a cross-sectional shape of an inverted taper.

* * * * *